(12) United States Patent
Engelbart et al.

(10) Patent No.: US 11,181,887 B2
(45) Date of Patent: *Nov. 23, 2021

(54) PREDICTIVE SURFACE ADJUSTMENT FOR JOINT ASSEMBLY

(71) Applicant: The Boeing Company, Chicago, IL (US)

(72) Inventors: Roger W. Engelbart, St. Louis, MO (US); James L. Scherer, St. Peters, MO (US); Christopher M. Vaccaro, O'Fallon, MO (US); Brian Stutzman, Florissant, MO (US); George E. Bible, Chesterfield, MO (US); Jeffrey J. Kilwin, St. Peters, MO (US)

(73) Assignee: The Boeing Company, Chicago, IL (US)

( * ) Notice: Subject to any disclaimer, the term of this patent is extended or adjusted under 35 U.S.C. 154(b) by 185 days.

This patent is subject to a terminal disclaimer.

(21) Appl. No.: 16/221,278

(22) Filed: Dec. 14, 2018

(65) Prior Publication Data
US 2020/0192331 A1  Jun. 18, 2020

(51) Int. Cl.
*G05B 19/4099*  (2006.01)
*B64F 5/10*  (2017.01)
(Continued)

(52) U.S. Cl.
CPC ........ *G05B 19/4099* (2013.01); *B29C 70/545* (2013.01); *B64F 5/10* (2017.01);
(Continued)

(58) Field of Classification Search
CPC ... G05B 19/4099; G05B 19/4207; B64F 5/10; G06F 30/15; B29C 70/545; B29C 73/02;
(Continued)

(56) References Cited

U.S. PATENT DOCUMENTS

| 4,848,137 A | 7/1989 | Turner et al. |
| 6,618,505 B2 | 9/2003 | Cork et al. |

(Continued)

FOREIGN PATENT DOCUMENTS

| WO | 0166414 A1 | 9/2001 |
| WO | 2014186089 A1 | 11/2014 |

OTHER PUBLICATIONS

Dalin et al, "Measurement of the Thickness of U-30MES-5NT and VGM-L Sealing Compound Layers in Aircraft Products Using the Ultrasonic Nondestructive Testing Method", Polymer Science, Series D. Glues and Sealing Materials, 2012, vol. 5, No. 4, pp. 305-308.

(Continued)

*Primary Examiner* — Thomas C Lee
*Assistant Examiner* — Michael Tang
(74) *Attorney, Agent, or Firm* — Kolisch Hartwell, P.C.

(57) ABSTRACT

A method and system provide for reducing gaps between two mating parts. Either or both parts may be nondestructively inspected at a plurality of locations on a surface to gather a data set relating to the part thickness. The data set may be used to calculate a set of as-built thickness values for the part and a set of deviations from a design model. A mating area may be determined for mating surfaces of the parts. One or more layers of sacrificial material in the mating area may be prepared for any deviations greater than a design allowance. The system may include a ply cutting device and an additive manufacturing device coupled to a computer to receive the sacrificial material layer data and shim data and to cut the one or more layers of sacrificial material and to construct the shim. A shim may be constructed for any deviations equal to or greater than a minimum shim thickness. The one or more layers of sacrificial material may be applied to the part, cured, and machined to a desired thickness. The shim may be applied between the (Continued)

part surfaces. The parts may be fitted and assembled together.

20 Claims, 14 Drawing Sheets

(51) Int. Cl.
   *G06F 30/15* (2020.01)
   *B29C 70/54* (2006.01)
   *G05B 19/42* (2006.01)
   *B33Y 10/00* (2015.01)
   *B33Y 50/02* (2015.01)
   *B33Y 70/00* (2020.01)
   *B33Y 80/00* (2015.01)
   *B29L 31/30* (2006.01)

(52) U.S. Cl.
   CPC ......... *G05B 19/4207* (2013.01); *G06F 30/15* (2020.01); *B29L 2031/3076* (2013.01); *B33Y 10/00* (2014.12); *B33Y 50/02* (2014.12); *B33Y 70/00* (2014.12); *B33Y 80/00* (2014.12)

(58) Field of Classification Search
   CPC ......... B29C 73/04; B33Y 10/00; B33Y 50/02; B33Y 70/00; B33Y 80/00; B29L 2031/3076; G01N 2291/0231; G01N 2291/02854; G01N 2291/2694; G01N 29/07; G01N 29/0645; G01N 29/4472; G01N 29/043
   See application file for complete search history.

(56) References Cited

U.S. PATENT DOCUMENTS

| | | |
|---|---|---|
| 7,141,191 B2 | 11/2006 | Engwall et al. |
| 7,626,692 B2 | 12/2009 | Engelbart et al. |
| 7,730,789 B2 | 6/2010 | Odendahl |
| 7,887,729 B2 | 2/2011 | Tye et al. |
| 8,094,921 B2 | 1/2012 | Engelbart et al. |
| 8,209,838 B2 | 7/2012 | Lindgren |
| 8,583,271 B2 | 11/2013 | Engelbart et al. |
| 8,687,872 B2 | 4/2014 | Engelbart et al. |
| 8,756,792 B2 | 6/2014 | Boyl-Davis et al. |
| 8,813,382 B1 | 8/2014 | Buttrick |
| 9,038,470 B1 | 5/2015 | Engelbart et al. |
| 9,068,809 B1 | 6/2015 | Lagally et al. |
| 9,082,209 B1 | 7/2015 | Engelbart |
| 9,214,018 B1 | 12/2015 | Engelbart |
| 9,429,935 B2 | 8/2016 | Boyl-Davis et al. |
| 9,586,367 B2 | 3/2017 | Drewett et al. |
| 9,595,096 B2 | 3/2017 | Dorris et al. |
| 9,645,095 B2 | 5/2017 | Engelbart et al. |
| 10,108,766 B2 | 10/2018 | Druckman et al. |
| 10,139,808 B2 * | 11/2018 | Engelbart ............ B29C 64/386 |
| 10,371,506 B2 | 8/2019 | Chang et al. |
| 2008/0141777 A1 | 6/2008 | Engelbart et al. |
| 2009/0100791 A1 | 4/2009 | Kayani et al. |
| 2010/0112190 A1* | 5/2010 | Drewett ................ B29C 73/10 427/9 |
| 2012/0316666 A1 | 12/2012 | Boyl-Davis et al. |
| 2013/0212129 A1* | 8/2013 | Lawson ................ H04L 67/18 707/779 |
| 2013/0266770 A1* | 10/2013 | Otto ...................... B64C 1/069 428/172 |
| 2014/0165360 A1* | 6/2014 | Mangiarino ........... B62D 65/06 29/407.1 |
| 2015/0227617 A1* | 8/2015 | Copass .................. H04L 67/10 707/756 |
| 2015/0254835 A1 | 9/2015 | Dorris et al. |
| 2015/0273760 A1 | 10/2015 | Engelbart |
| 2015/0276376 A1 | 10/2015 | Lagally et al. |
| 2016/0097728 A1 | 4/2016 | Engelbart et al. |
| 2016/0121556 A1* | 5/2016 | Spellman ............... B29C 70/38 264/409 |
| 2017/0138385 A1* | 5/2017 | Clark ...................... G06F 30/15 |
| 2017/0327201 A1* | 11/2017 | Doyle .................... G01B 11/14 |
| 2018/0067476 A1 | 3/2018 | Engelbart et al. |

OTHER PUBLICATIONS

European Patent Office, Extended European Search Report regarding European Patent Application No. 17189438.9-1224, dated Jan. 24, 2018, 10 pages.
U.S. Patent and Trademark Office, Notice of Allowance regarding U.S. Appl. No. 15/258,271, dated Mar. 29, 2018, 11 pages.
U.S. Patent and Trademark Office, Non-Final Office Action regarding U.S. Appl. No. 16/239,497, dated Mar. 27, 2020, 14 pages.
European Patent Office, Extended European Search Report regarding European Patent Application No. 19204647.2, dated Apr. 15, 2020, 8 pages.

\* cited by examiner

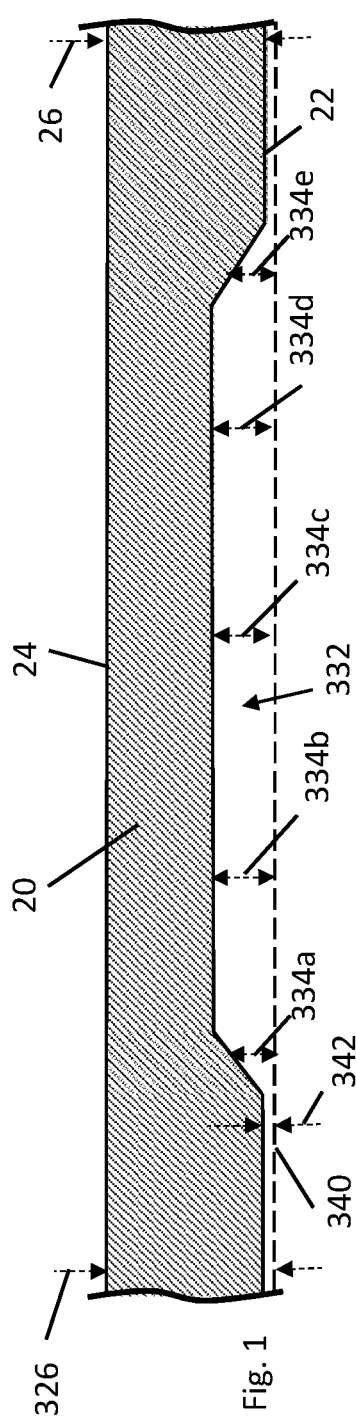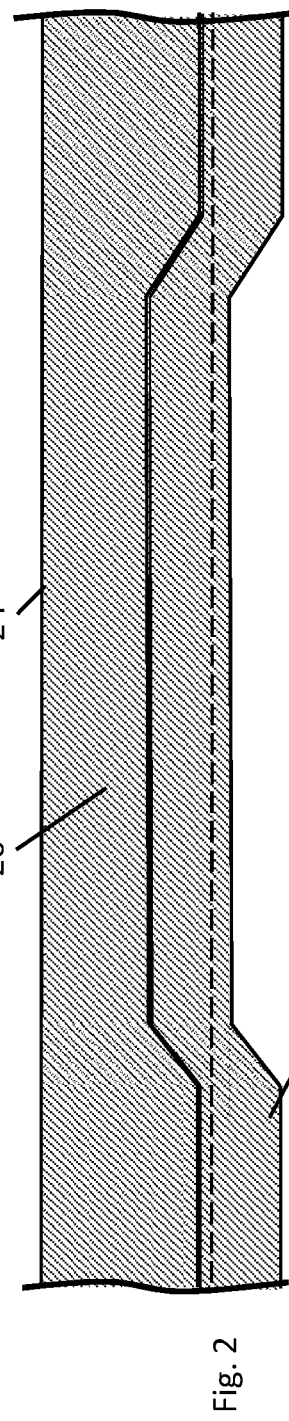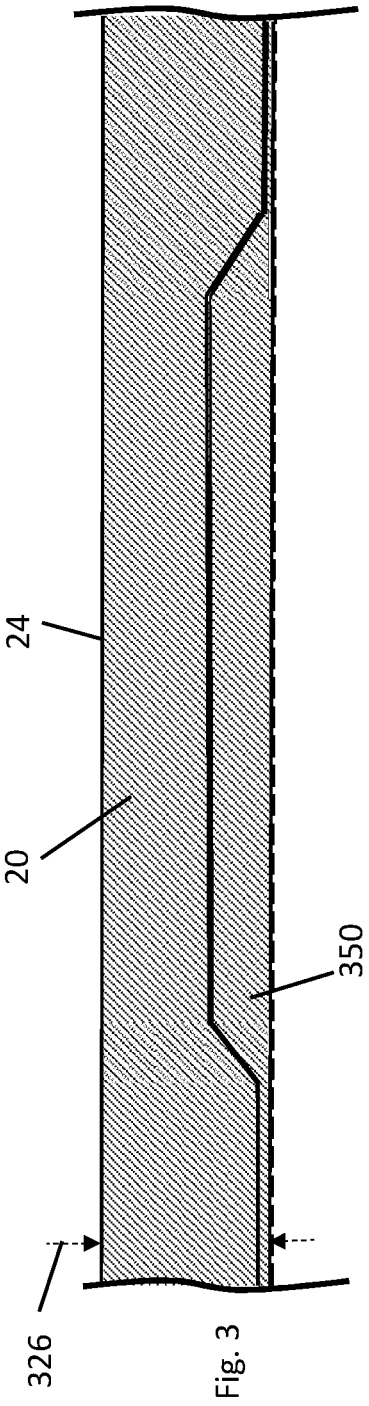

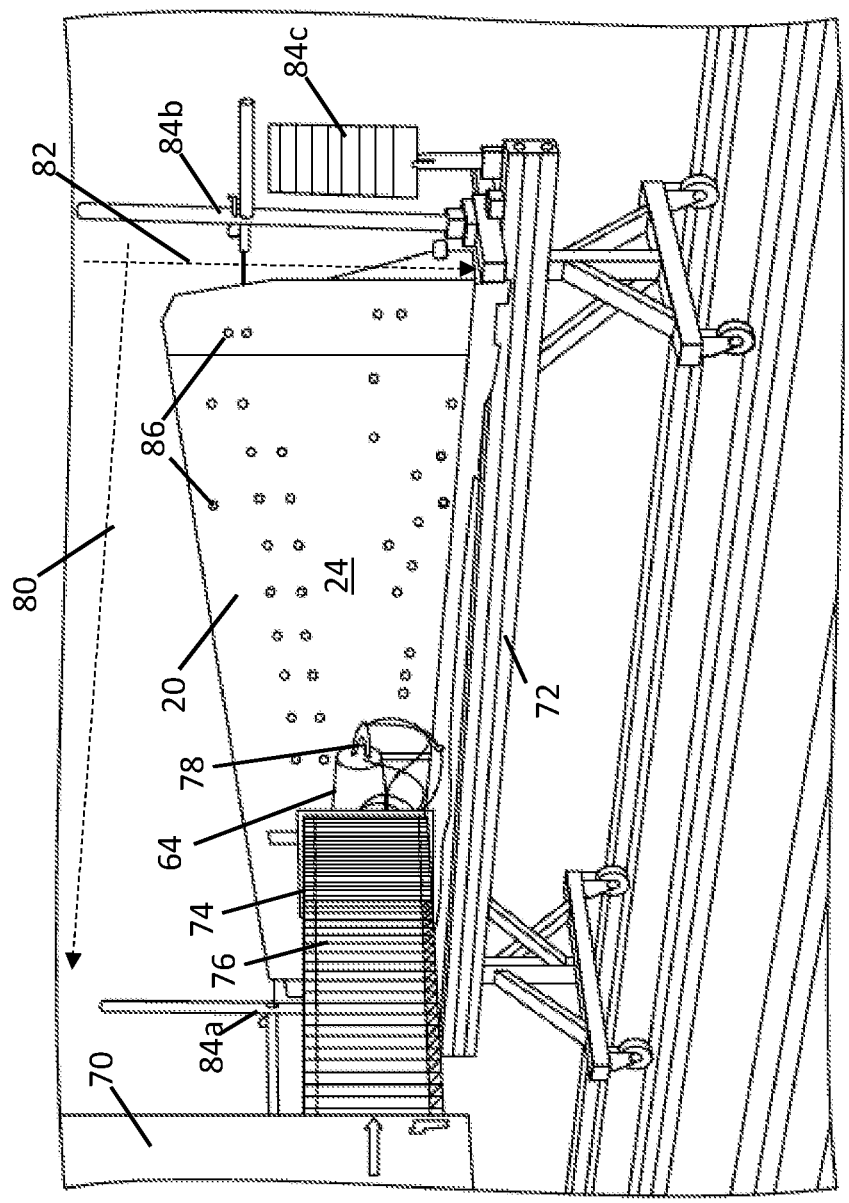
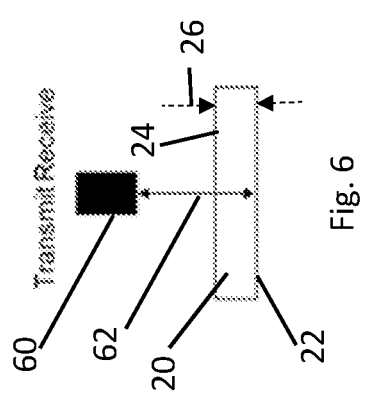
Fig. 6
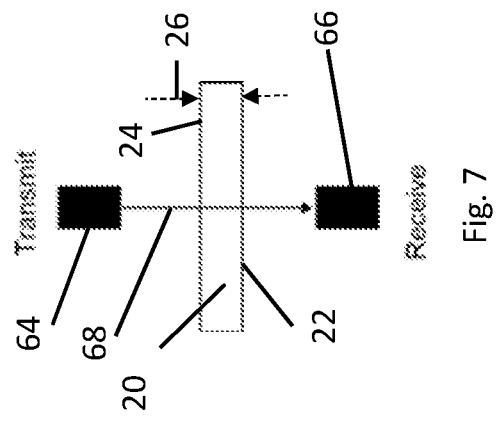
Fig. 7
Fig. 8

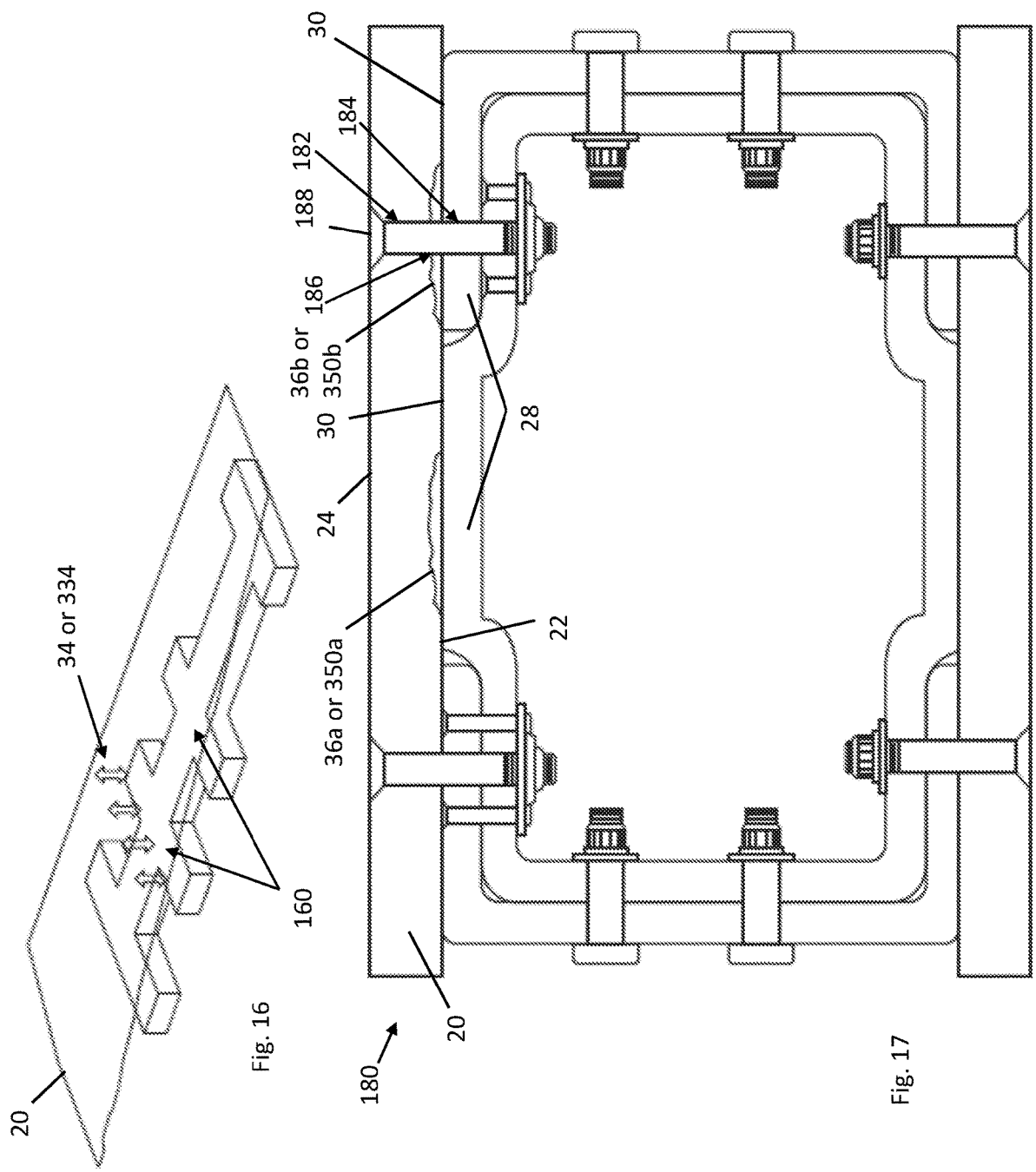

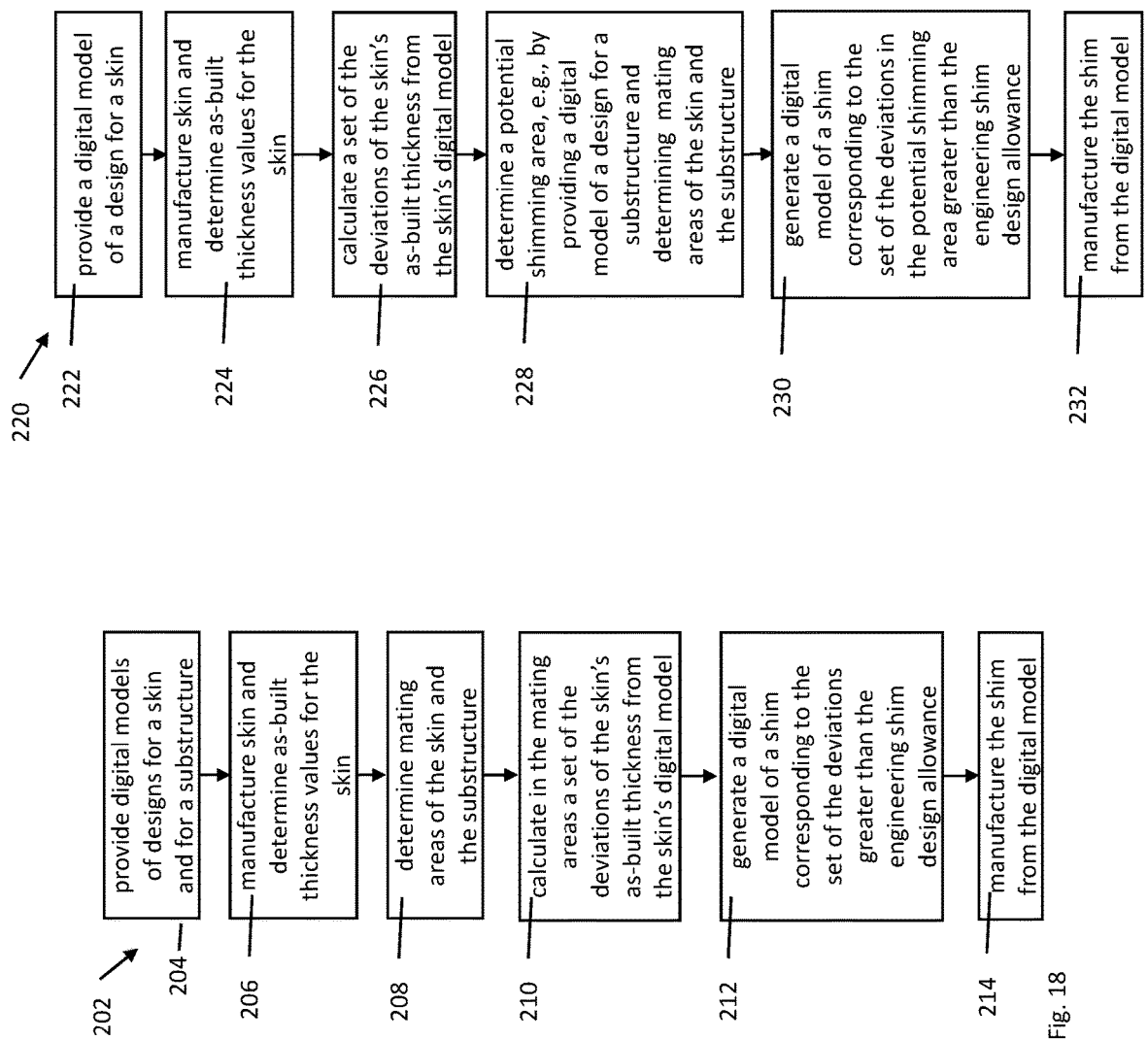

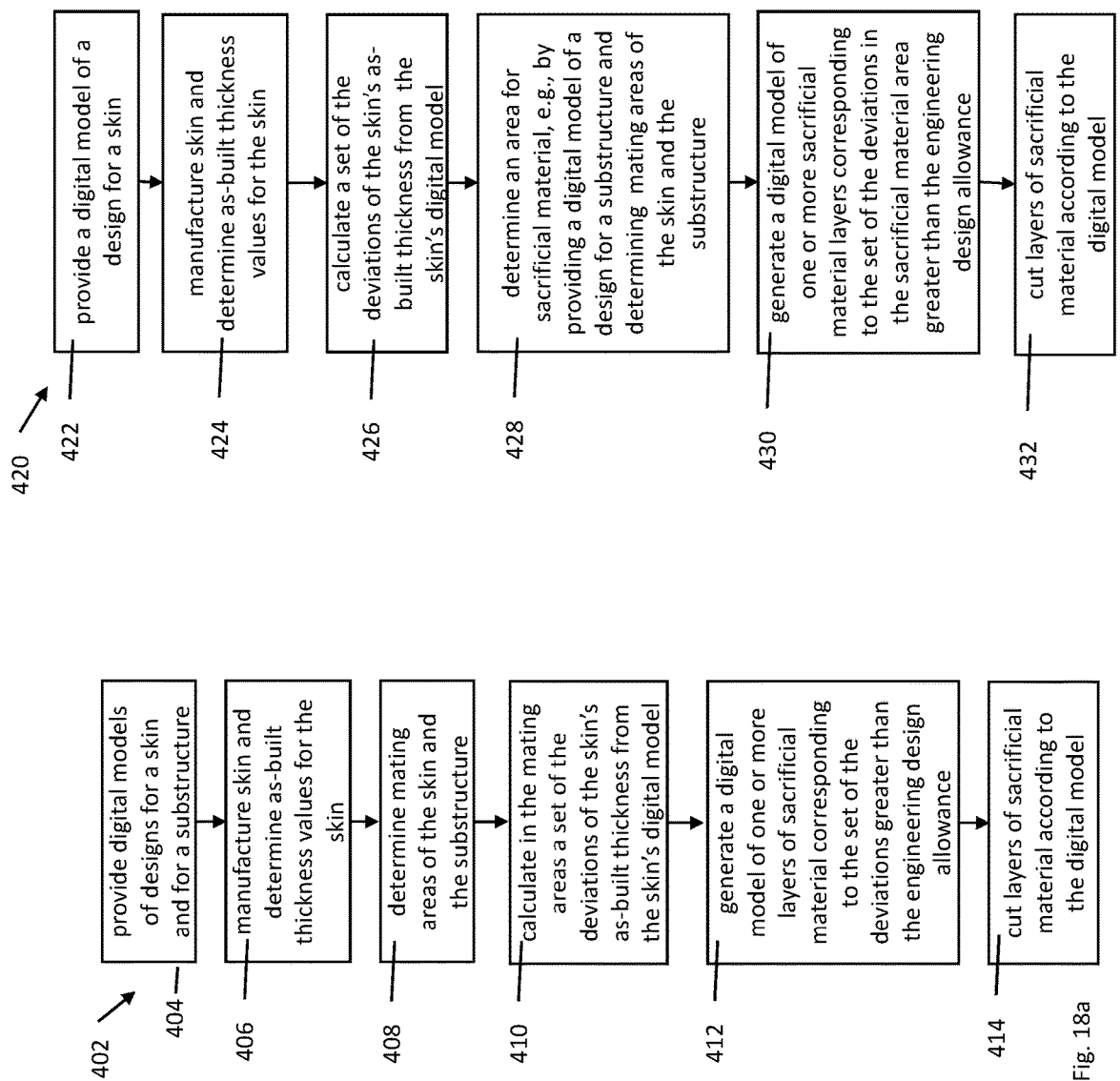

PREDICTIVE SURFACE ADJUSTMENT FOR JOINT ASSEMBLY

FIELD

This disclosure relates to techniques for gathering and using data from nondestructive inspection of parts for use in assembling the parts. More specifically, the disclosed embodiments relate to systems and methods for using the data to determine potential needs for adding sacrificial material and for machining sacrificial material to reduce gaps in a joint between part surfaces.

INTRODUCTION

Parts may be manufactured for assembly from composite materials or metallic materials and either of these types of parts may be subjected to nondestructive inspection prior to assembly. Nondestructive inspection methods include the use of ultrasonics, eddy current, x-ray, magnetic resonance, optical imaging, and microwave.

Typically, the nondestructive inspection is performed to characterize qualities of the parts. For example, a part made of a composite material, such as carbon-fiber-reinforced polymer, may have delaminations where adjacent layers of carbon fiber separate from one another, the extent and effect of which may be characterized by inspection. Parts may include unintended voids in the structure which may create a degree of porosity that may be measured and located. Nondestructive inspection, such as ultrasound inspection, will typically gather data about the part in the course of detecting and locating such characteristics.

Proper assembly of parts, for example mounting an aerodynamic (or aero) surface or skin to a substructure, such as a spar or rib, requires fitting the parts together at mating surfaces within predetermined limits, for example, not leaving any gap between the mating surfaces greater than a predetermined shim allowance. A gap greater than the predetermined shim allowance may be filled with a shim for reasons of aerodynamic performance and structural integrity.

Determining the presence of gaps in joints and the necessity and size and shape of shims may require a labor-intensive, iterative process following the fabrication and nondestructive testing of the parts. Parts may be temporarily assembled and then visually inspected and measured for gaps between the skin and substructure. The parts may then be dismantled and, for gaps greater than the predetermined shim allowance, a trial shim fabricated. The parts may then be reassembled with the shim temporarily secured in place, to check the fit. This is a second temporary assembly operation and such operations may need to be repeated until the shim fit is satisfactory. Alternatively, gaps found in the temporary assembly of the parts that are less than the predetermined shim allowance may be left unfilled.

Accordingly, there is a need for a method and a system for making use of information obtained from nondestructive inspection of parts in combination with digital models of the parts for determining the dimensions of shims and constructing such shims without the need for time-consuming iterative processes that impact production flow and require significant touch labor. Also, there is a need for a method and a system for making use of information obtained from nondestructive inspection of parts in combination with digital models of the parts for determining the presence of a gap less than the predetermined shim allowance and the need for adding sacrificial material and machining the sacrificial material in a desired amount without the need for time-consuming iterative processes that impact production flow and require significant touch labor.

SUMMARY

The present disclosure provides methods and systems for predicting one or more gaps in a joint between parts, and, for gaps greater than a design allowance and less than a predetermined shim allowance, adding one or more layers of sacrificial material and machining the sacrificial material to reduce the gaps. In some embodiments, a method for adding one or more layers of sacrificial material to a skin for assembling the skin to a substructure may include nondestructively inspecting the skin at a plurality of locations of at least one of the inner and outer surfaces of the skin to gather a data set relating to the skin thickness. The method may further include a step of calculating, using the data set, a set of as-built thickness values for the skin for at least a portion of the plurality of locations. The method may further include a step of determining a mating area of the inner surface of the skin with a mating surface of the substructure. The method may further include a step of generating a set of sacrificial material layer data by calculating in the mating area of the inner surface of the skin a set of deviations greater than the design allowance of the set of as-built thickness values from the nominal map of the skin thickness. The method may further include a step of generating a set of sacrificial material removal data using the set of sacrificial material layer data and the set of deviations greater than the design allowance of the set of as-built thickness values from the nominal map of the skin thickness. The method may further include steps of adding the one or more layers of sacrificial material to the skin and removing a portion of the sacrificial material from the skin.

In other embodiments, a method for reducing gaps in a joint assembly of a skin to a substructure may include a step of nondestructively inspecting the skin at a plurality of locations of at least one of the inner and outer surfaces of the skin to gather a data set relating to the skin thickness. The method may further include a step of calculating, using the data set, a set of as-built thickness values for the skin for at least a portion of the plurality of locations. The method may further include a step of determining the mating area of the inner surface of the skin with the mating surface of the substructure. The method may further include a step of calculating in the mating area of the inner surface of the skin a set of deviations greater than the design allowance of the set of as-built thickness values from the nominal map of the skin thickness. The method may further include a step, for any deviations greater than the design allowance and equal to or greater than a minimum shim thickness, of constructing a shim to have an outline and profile to match the set of deviations. The method may further include a step, for any deviations greater than the design allowance and less than a minimum shim thickness, of preparing one or more layers of sacrificial material in the mating area between the inner surface of the skin and the substructure. The method may further include a step of attaching the one or more layers of sacrificial material to the skin. The method may further include a step of curing the one or more layers of sacrificial material on the skin. The method may further include a step of machining the one or more layers of sacrificial material.

In other embodiments, a system for adding one or more layers of sacrificial material to a first part defining a first mating surface for assembly of the first part to a second part defining a second mating surface, may include a nondestructive inspection system configured to inspect the first part to gather a data set relating to the first part. The system may further include a computer coupled to the nondestructive inspection system and configured to receive the data set relating to the first part and to store a first nominal map of the first part, a second nominal map of the second part, and a design allowance. The computer may include a processing element configured to calculate, from the data set relating to the first part, an as-built thickness profile for at least a portion of the first part, and to virtually overlay the first nominal map of the first part on the second nominal map of the second part to determine a mating area of the first part and the second part. The computer may be configured to generate in the mating area a set of sacrificial material layer data by calculating a set of deviations greater than the design allowance of the as-built thickness profile of the first part from the nominal map of the first part. The system may further include a ply cutting device coupled to the computer to receive the sacrificial material layer data and configured to cut the one or more layers of sacrificial material. The system may further include an additive manufacturing device coupled to the computer to receive the shim dimension data and configured to construct the shim. The system may further include that the computer is configured to perform a virtual skin up net fit check using the as-built thickness of the first part, a second digital model of the second part, the shim dimension data, and the sacrificial material layer data.

The present disclosure also provides methods and systems for predicting a set of dimension data for a shim to be used at a joint between parts, and may include manufacture of the shim and installation of the shim in the joint. In some embodiments, a method for creating a shim for use in mounting a skin to a substructure may include nondestructively inspecting the skin at a plurality of locations of the skin surfaces to gather a data set relating to the skin thickness. The method may include a step of calculating, using the data set relating to the skin thickness, a set of as-built thickness values for the skin for at least a portion of the plurality of locations. The method may further include a step of determining the mating area of the inner surface of the skin with the mating surface of the substructure. The method may include a step of generating the set of shim dimension data by calculating, in the mating area of the inner surface of the skin, a set of deviations greater than a shimming design allowance of the as-built thickness values from a nominal map of the skin thickness. The set of shim dimension data may define a three-dimensional shim contour. The shim predicted by the method may be configured to fill any gaps greater than a shimming design allowance in the mating area between the inner surface of the skin and the substructure.

Features, functions, and advantages may be achieved independently in various embodiments of the present disclosure, or may be combined in yet other embodiments, further details of which can be seen with reference to the following description and drawings.

BRIEF DESCRIPTION OF THE DRAWINGS

FIG. 1 is a cross-sectional view of a skin including an area for mating with a substructure, showing a set of deviations in the thickness profile of the skin compared to an expected thickness of the skin.

FIG. 2 is a cross-sectional view of the skin of FIG. 1 with added sacrificial material sufficient for filling the gap between the thickness profile of the skin and the expected thickness of the skin, prior to machining.

FIG. 3 is a cross-sectional view of the skin with added sacrificial material of FIG. 2 after machining.

FIG. 6 is a schematic view of an ultrasound system for nondestructive inspection of a part, showing an ultrasound transmitter and receiver positioned on the same side of the part, for probing the part by pulse-echo analysis.

FIG. 7 is a schematic view of an ultrasound system for nondestructive inspection of a part, showing an ultrasound transmitter on one side of the part and an ultrasound receiver on an opposite side of the part, for probing the part by through-transmission of ultrasound.

FIG. 8 is a perspective view of an ultrasound inspection system, showing an aero-surface or skin, in particular an aircraft flap, as the part under inspection, mounted on a gantry for movement in relation to the inspection, and also showing an extendable arm with an accordion enclosure and an end effector that includes a water nozzle and an ultrasound transducer for inspection of the part, representing either a pulse-echo system, or, in combination with a corresponding arm (not visible) behind the part under inspection, a through-transmission system.

FIG. 16 is an isometric view illustrating the calculations in the mating area of the aero-surface and the substructure the set of deviations greater than a design allowance of the as-built thickness values from the nominal map of the aero-surface thickness.

FIG. 17 is a cross-sectional view of a pair of shims constructed by additive manufacturing and installed between a skin and a substructure in accordance with the present disclosure.

FIG. 18 is an illustration of operations performed in one or more embodiments of the present disclosure for generating data relating to a shim, showing the step of virtual determination of the mating area of the skin and substructure being performed before the step of calculating the set of deviations of the as-built thickness values from the nominal thickness values, the calculating of the set of deviations being performed only in the mating area.

FIG. 19 is an illustration of operations performed in one or more embodiments of the present disclosure for generating data relating to a shim, showing the step of virtual determination of the mating area of the skin and substructure being performed after the step of calculating the set of deviations of the as-built thickness values from the nominal thickness values, the calculating of the set of deviations being performed for the entirety of the skin outline. FIG. 18a is an illustration of operations performed in one or more embodiments of the present disclosure for generating data relating to one or more layers of sacrificial material, showing the step of virtual determination of the mating area of the skin and substructure being performed before the step of calculating the set of deviations of the as-built thickness values from the nominal thickness values, the calculating of the set of deviations being performed only in the mating area.

FIG. 19a is an illustration of operations performed in one or more embodiments of the present disclosure for generating data relating to one or more layers of sacrificial material, showing the step of virtual determination of the mating area of the skin and substructure being performed after the step of calculating the set of deviations of the as-built thickness values from the nominal thickness values, the calculating of the set of deviations being performed for the entirety of the skin outline.

DESCRIPTION

Figure 4:
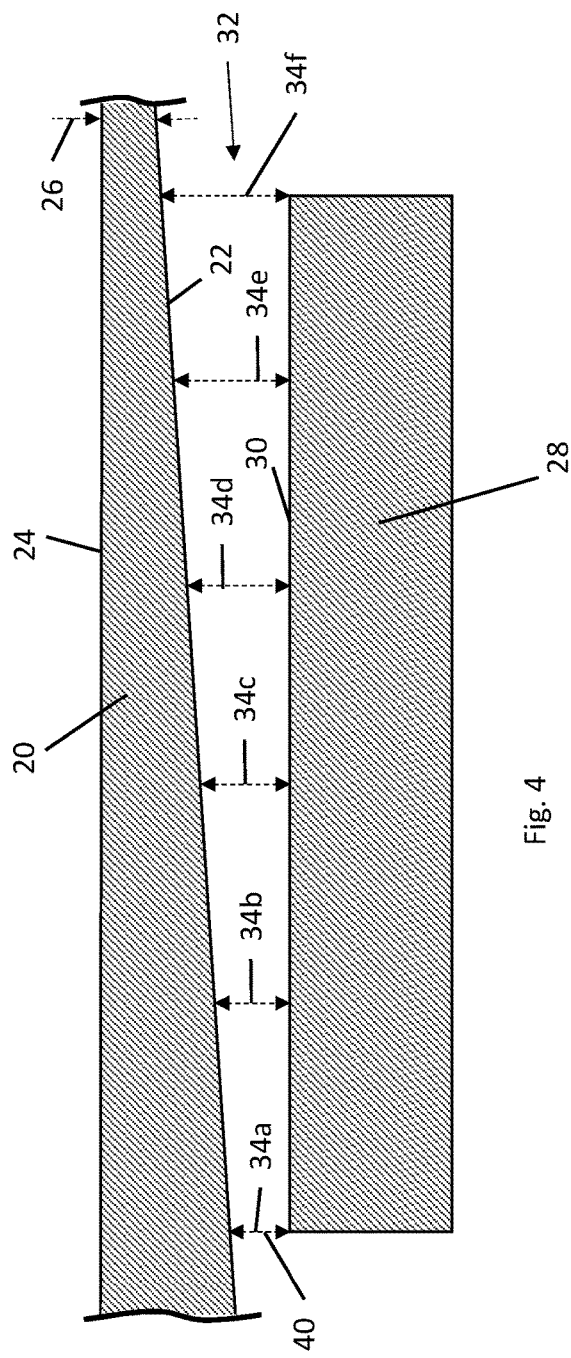
FIG. 4 is a cross-sectional view of a skin mating with a substructure, showing a set of deviations in the thickness profile of the skin leaving a gap between an inner mating surface of the skin with the upper mating surface of the substructure.

Various embodiments of methods and systems for reducing gaps between mating parts, e.g., a skin and a substructure, are described herein that may make use of data from nondestructive inspection of one or both of the parts to determine whether and to what extent to prepare additional material for installation between the parts. The data from nondestructive inspection may be used for predicting the size and shape of a shim, and whether a shim can be used, as described herein. Embodiments that may include determining the need for adding sacrificial material, and subsequent machining of that material, based on dimensional data from nondestructive inspection are described below and illustrated in the associated drawings. Unless otherwise specified, the methods and systems and/or their various constituent pieces may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other similar embodiments, such as those for constructing the predicted shim and/or determining need for sacrificial material and its subsequent machining. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Embodiments of the present disclosure may eliminate the need to pre-assemble parts, such as pre-assembling a skin to a substructure, and manually to measure the gap condition(s) in order to estimate location and size of and subsequent machining of sacrificial material and/or a shim location, contour, and dimensions. Embodiments of the present disclosure are directed to automating the data collection process to determine location, shape, and size of required shims and/or sacrificial material and may automatically deliver all required data to automated shim fabrication systems and/or ply-cutting devices and machining equipment. Embodiments of the present disclosure may allow shimming and sacrificial material requirements to be established with required shims produced and/or installed and plies cut, applied, cured, and machined in advance of assembly operations. The expected result is effectively to remove significant labor cost and cycle time from critical path assembly operations. Embodiments of the present disclosure may provide for automated statistical process control (SPC) data collection and analysis to support process capability determination for improved efficiency and quality, and more repeatable processes. Embodiments of the present disclosure may seek to reduce shimming and sacrificial material requirements during future fabrication and assembly, particularly where data analytics demonstrate a potential lack of repeatability that can be mitigated through changes to design and manufacturing processes. Embodiments of the present disclosure may support Full Size to Full Size Determinate Assembly and Precision Assembly (FSDA/PA), which may allow detail parts, substructure, and skins to be fabricated complete with all holes incorporated in the final designed condition. This in turn may allow assembly to occur without the performance of drilling operations on assembly, further eliminating significant labor cost and cycle time from assembly operations, reducing nonconformances, and eliminating a major source of workplace recordable injuries and lost work days. Embodiments of the present disclosure have the potential to eliminate one or more temporary assembly operations, with a substantial cost savings.

FIGS. 1-3 illustrate a component that will be aligned for assembly with another part, where a gap or deviation exists between an as-built thickness of the component and an expected thickness from a digital model of the component. More specifically, the component, such as an aero-surface or skin 20, defines an inner surface 22 and an outer surface 24. Typically, skin 20, if made of a composite material, includes one or more layers containing carbon fiber between surfaces 22 and 24. For example, skin 20 may include fiber reinforcement infused with polymer resin. Skin 20 may alternatively include a plurality of layers of fiber reinforcement pre-impregnated with resin (also known as "prepreg"). The prepreg is laminated and cured and/or consolidated to create the final composite material. Fiber reinforcement may be carbon, glass or other suitable material and the resin may be epoxy or other suitable material.

In some instances, inner surface 22 and outer surface 24 may be substantially parallel to one another. Skin 20 defines as-built thickness 26 between surfaces 22 and 24, which may vary in value over the surface area. Thickness 26 is defined in a direction that is perpendicular to at least one of the surfaces, and, in cases where the surfaces are substantially parallel, perpendicular to both surfaces.

Skin 20 may have an expected thickness 326 as defined by expected surface 340. As-built thickness 26 of skin 20 may deviate from expected thickness 326 and inner surface 22 may deviate from expected surface 340 for one or more reasons of variation in the parts' structures, e.g., due to variations in processing conditions or variability in dimension of raw materials used to build skin 20, resulting in an as-built thickness dimension or profile of the skin deviating in an area from a designed thickness profile. The deviation from expected thickness 326 is depicted in FIGS. 1-3 as a variance in inner surface 22 but such deviation from expected thickness may in practice relate to variance that may be associated with either or both of the inner and outer surfaces—in any case, the system and method described herein address the actual deviation from the designed thickness profile.

A gap 332 may vary over the area of the deviation, as indicated by the differing heights of arrows 334a-e. The cross-sectional view of FIG. 1 shows the set of deviations of the as-built thickness profile from the designed thickness profile along a first dimension, and the set of deviations will also be distributed along a second dimension, the deviations in the two dimensions defining an outline of the area of the gap. FIG. 1 also illustrates a design allowance 342 for the deviation between the as-built thickness profile and the designed thickness profile, where deviation greater than the design allowance may require filling and less than may not require filling.

FIG. 2 illustrates skin 20 as in FIG. 2 with one or more layers of sacrificial material 350 added to inner surface 22 of skin 20 in the area of gap 332. The sacrificial material is illustrated in FIGS. 2 and 3 schematically and may be larger or smaller relative to skin 20 in practice. Typically, sacrificial material 350 will add to thickness 26 of skin 20 sufficiently to at least fill in, or to more than fill in, gap 332 and any excess will be machined to the desired thickness.

For skin 20 formed of a composite material, sacrificial material may be any suitable material, such as a fiberglass/epoxy prepreg. After addition to skin 20, the sacrificial material may be compacted onto the skin 20 (typically with a vacuum bag assembly) and cured (typically with the application of heat in the form of infrared, resistive heating blanket or other suitable alternatives).

Once cured, the sacrificial material 350 may be machined with a suitable cutting tool to adjust the thickness of skin 20 to more closely conform to the expected thickness 326, as illustrated in FIG. 3. The sacrificial material may be added in a layer sufficiently thick to ensure that during the machining process the cutting tool does not penetrate or otherwise damage layers below the sacrificial material, such as layers with carbon fibers of the skin 20.

Figure 5:
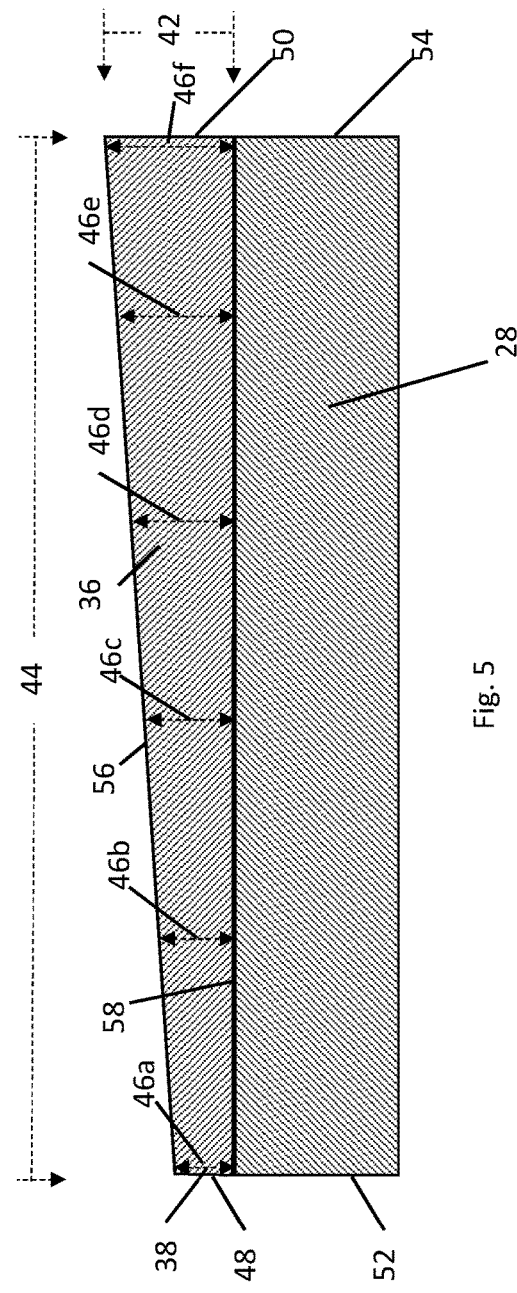
FIG. 5 is a cross-sectional view of a shim having an outline and profile for filling the gap between the parts of FIG. 4.

FIG. 4 illustrates two components or parts aligned for assembly and a gap between the two parts, and FIG. 5 shows a shim for filling the gap. More specifically, a first component or part, such as an aero-surface or skin 20, defines an inner surface 22 and an outer surface 24. Typically, inner surface 22 and outer surface 24 are substantially parallel to one another. Skin 20 defines a thickness 26 between surfaces 22 and 24, which may vary in value over the surface area. Thickness 26 is defined in a direction that is perpendicular to at least one of the surfaces, and, in cases where the surfaces are substantially parallel, perpendicular to both surfaces. Skin 20 is being aligned in FIG. 4 with a second part, such as a substructure 28, which may, e.g., be a structural spar or rib. Substructure 28 includes an upper mating surface 30. Inner surface 22 of skin 20 may be received on upper mating surface 30 of substructure 28.

A gap 32 may exist between surface 22 and surface 30 for one or more reasons of variation in the parts' structures, e.g., due to an as-built thickness dimension or profile of the skin deviating in an area from a designed thickness profile. Gap 32 may vary over the area, as indicated by the differing heights of arrows 34a-f. The cross-sectional view of FIG. 4 shows the set of deviations of the as-built thickness profile from the designed thickness profile along a first dimension, and the set of deviations will also be distributed along a second dimension, the deviations in the two dimensions defining an outline of the area of the gap. Gap 32 in FIG. 4 is illustrated as resulting from one part having such deviations in thickness, and other variations in part structure may result in gaps.

A shim 36 for filling the gap is shown in FIG. 5, which typically has a minimum thickness 38 corresponding to an engineering design allowance 40 (FIG. 4) for a shim. For example, engineering requirements for joining an aerosurface to a substructure typically define a shimming design allowance of about 0.005" to 0.008", or in some cases in a range of about 0.005" to 0.015", depending on aerodynamic and structural considerations, where deviations greater than the shimming design allowance may require shimming of the gap. The range of the design allowance will also vary for the size and geometry of the parts being assembled, so the design allowance may be many times greater or smaller than the example range. Generally, the shimming design allowance for gaps will correspond to a design tolerance for one part's thickness, and the shim may be sized and shaped correspondingly with the part's thickness deviations greater than the design tolerance. Where other variations in part structure result in gaps or the thicknesses of both parts deviate in a substantial manner, the relationship between the thickness deviations and the shim size and shape may be more complex.

Shim 36 has a profile 42 and an outline 44 configured substantially to fill gap 32. For example, as seen along one dimension of outline 44 in FIG. 5, shim 36 has a generally wedge-shaped profile, increasing from the minimum thickness on a left edge 48 through thickness values 46$a$-$f$ to a right edge 50, generally corresponding to the differing heights 34$a$-$f$ of gap 32 related to the deviations of the as-built thickness of skin 20 from its designed thickness profile. The outline of the shim is two-dimensional in a plane generally coplanar with the planes of one or both of the mating surfaces. The second dimension (not shown in FIG. 5) of outline 44 is along edges 48, 50.

As shown in FIG. 5, edges 48, 50 of shim 36 correspond to a pair of edges 52, 54 of substructure 28—shim 36 has an outline for filling the gap between the two parts where their surfaces mate and typically does not extend beyond that. Alternatively, shim 36 may have an outline extending beyond the mating surfaces where best suited to a particular application. Shim 36 includes an upper surface 56 for mating with inner surface 22 of skin 20 and a lower surface 58 for mating with upper surface 30 of substructure 28.

Profile 42 of shim 36, as shown in the example of FIG. 5, has a simple wedge shape because that corresponds to the shape of gap 32. Generally, the shim profile will be configured to fill such gap for any shape of the gap. For example, the shim may have a structure in two horizontal dimensions and in a thickness dimension that is customized to compensate for the deviations greater than the design allowance of the as-built thickness of the skin from the designed thickness profile of the skin. As will be discussed below, such shim structure may be more complex than a wedge shape.

As noted above, nondestructive inspection to characterize part qualities, such as checking porosity and for delaminations, may be required and carried out for parts prior to assembly. Additionally the nondestructive inspection may be useful for either or both of the methods described above: sacrificial material addition and shimming by providing dimensional information about the part under inspection.

Ultrasound analysis is an example of nondestructive inspection. An ultrasound system may use pulse-echo or through-transmission techniques to gather data in such inspection. Typically for pulse-echo, an arm of the inspection system has, as shown in FIG. 6, an end effector 60 holding a water nozzle and an ultrasonic transducer that combines transmit and receive functions. End effector 60 may be moved over a surface of the part being inspected, and/or the part itself may be moved. The water nozzle provides a stream of water which carries an ultrasound signal 62 from the transducer into part 20. The ultrasound enters part 20 at either surface, e.g., surface 24 and travels through part 20, and bounces off the opposite surface, e.g., surface 22 of the part and returns to the sending transducer. Similarly, as shown in FIG. 7, a through-transmission ultrasound system may include a pair of end effectors 64, 66, one responsible for transmitting an ultrasound signal 68 and the other receiving it. Typically, each end effector is positioned to transmit and/or receive the ultrasound in a direction that is perpendicular to at least one of the surfaces, and, in the case of the surfaces being substantially parallel, perpendicular to both surfaces.

Typically, the velocity of sound in the material under inspection is known, as well as the spacing of each transmitter/receiver from the adjacent part surface. The ultrasound system is able to measure the time it takes for the ultrasonic signal to travel through the part, for example by gating an A-scan trace. The system typically makes and records each measurement for a location, defined by a coordinate pair in two horizontal dimensions, and this location is the same on both part surfaces. From this data, the ultrasound system or a connected computer may calculate the material thickness (rate×time=distance) at each location to which the system moves the end effector(s). For example, the inspection may involve a series of scan passes, where each scan pass produces a line of ultrasonic data. The series of scan passes may be built into a full picture of the part's thickness values at a set of locations over a 2-dimensional area of the part.

An example of an ultrasound inspection system 70 is shown in FIG. 8 where part 20, in this case an aircraft flap, is mounted on a gantry 72, allowing movement in relation to the inspection. An arm 74 may be movable in up-and-down and left-right dimensions, and may include an accordion enclosure 76 facilitating extension of arm 74 closer to, and farther from surface 24 of part 20. End effector 64 may include a water nozzle 78 to provide a stream of water to surface 24 (or surface 22). End effector 64 may include an ultrasound transmitter for providing the ultrasound signal via the stream water for inspection of the part. In a through-transmission system, end effector 66 with an ultrasound receiver may be mounted on an arm (not visible behind the part under inspection in FIG. 8) corresponding to arm 74. Alternatively, arm 74 may mount an ultrasound transducer for inspection of the part by pulse-echo analysis.

As can be seen in FIGS. 6-8, the ultrasound inspection system allows for nondestructively inspecting part 20 to gather a data set 100 (see FIG. 9) relating to part 20. Data set 100 may include information about the as-built structure of part 20 in two horizontal dimensions 80, 82, such as soundwave travel times, relating to a thickness dimension. The thickness dimension typically is defined as orthogonal to horizontal dimensions 80, 82. The soundwave travel times and related information (such as material density and structure or other information relating to the speed of sound in the material) may be used to calculate a set of thickness values for the as-built structure of part 20. Each thickness value may be defined at a location, e.g., a pair of coordinates in horizontal dimensions 80, 82 of part 20.

As further seen in FIG. 8, gantry 72 of the inspection system may include various positioning and alignment tools 84$a$-$c$ to aid in relating the inspection's measurements to the as-built structure. The part's as-built structure may also include one or more alignment indicators 86, each of which may be a mark for alignment and/or for future location of an assembly hole, or may be a pre-formed (in original construction or pre-drilled) assembly hole. Typically, alignment indicators 86 are placed at known, measured locations on the part corresponding to locations established for the design of the part. The inspection system may use one or more of the alignment indicators in relating measurements of the as-built structure to the design of the part.

Figure 9:
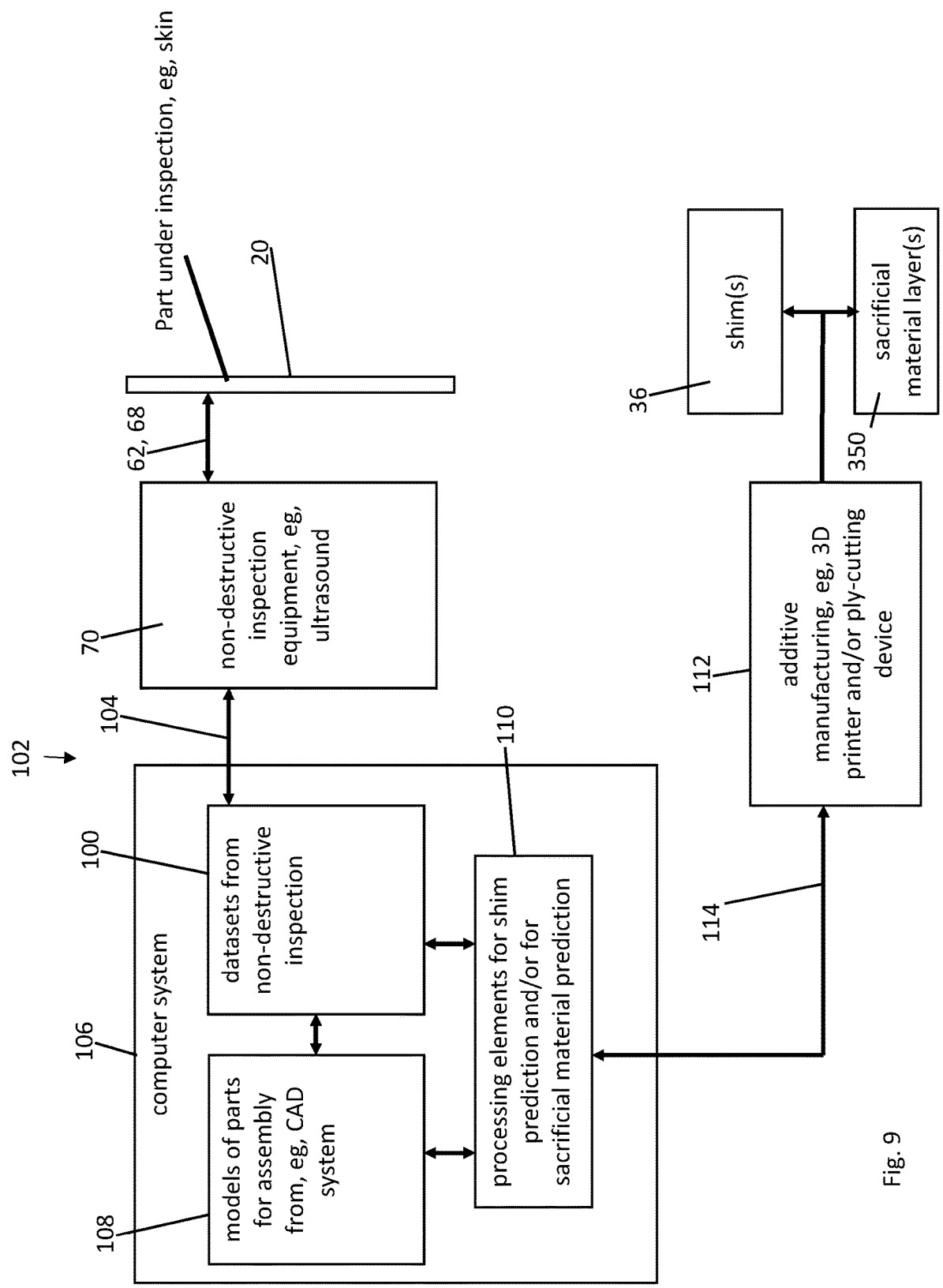
FIG. 9 is a block diagram of a system for predicting and constructing a shim and/or preparing one or more layers of sacrificial material according to an embodiment of the present disclosure, including a computer system storing models of parts or components, such as the aero-surface of FIG. 8, and datasets relating to parts or components that have undergone nondestructive inspection, a nondestructive inspection system, such as the ultrasound equipment of FIG. 6, 7, or 8, and an additive manufacturing system, such as a 3D printer.

As shown in FIG. 9, a system 102 may be configured for inspecting part 20 and predicting a gap condition and manufacturing shim 36 and/or determining the need for one or more layers of sacrificial material 350 for use in assembling part 20 to another part. System 102 may include nondestructive inspection equipment, such as ultrasound system 70. Such equipment may be configured to apply ultrasound signals 62 or 68 to part 20 and to communicate data 104 from the ultrasound measurements to a computer system 106. FIG. 9 depicts computer system 106 as separate from ultrasound system 70 and alternatively one or more portions or the whole of the computer system may be built-in to ultrasound system 70. Other division of the processing of data from inspection and the predicting and manufacturing of shims may be implemented as best suited to particular applications of embodiments of the present disclosure.

Computer system 106 may store one or more data sets 100 from the nondestructive inspection of skin 20. Computer system 106 may also store digital models 108 of parts, such as skin 20 and substructure 28. Models 108 may be sourced from a separate CAD system used to design skin 20 and/or substructure 28, or from another source, or computer system 106 may incorporate the CAD system used to design such parts.

A digital model 108 for a part, such as skin 20, may include a digital model that includes a nominal map for the skin in two horizontal dimensions and in a thickness dimension. A digital model 108 for a part, such as substructure 28 may include a nominal map for the substructure in two horizontal dimensions and in a thickness or height dimension. Computer system 106 may include one or more processing elements 110 that may make use of the digital models and the data sets from nondestructive inspection for predicting the size and shape of shim 36 and/or one or more layers of sacrificial material 350. Further details on the digital models, the inspection data sets, and the processing of data for shim prediction will be discussed in relation to FIGS. 10-16 below. For sacrificial material prediction, see the discussion in relation to FIGS. 10-16 and 20-24 below.

As further shown in FIG. 9, computer system 106 may be in communication with equipment, such as an additive manufacturing device 112, e.g., a 3D printer and/or other means of shim construction such as by machining with a numeric control (NC) program, of shim 36. For example, computer system 106 may generate a digital model 114 for shim 36. Computer system 106 may also send model 114 to additive manufacturing device 112, where the 3D printer or other equipment may use the digital model of the shim to construct the shim. In addition or alternatively, device 112 may include a ply-cutting device for preparing layers of sacrificial material. Computer system 106 may generate and send digital model 114 for one or more layers of sacrificial material 350, which may additionally include data for machining the sacrificial material after application and curing.

Model 114 for shim 36 may include a set of horizontal coordinate pairs and thickness values for shim 36. Generally, such thickness values will correspond to deviations 34 of the as-built thickness values of the skin from the digital model of the skin. Typically, such thickness values only include those that are greater than shim design allowance 40. Model 114 for shim 36 may also include a shim contour defined in three dimensions or a set of shim dimension data, in either case corresponding to the set of deviations 34 (typically those greater than the design tolerance) of the as-built thickness values for the skin from the nominal map of the skin thickness. Model 114 may also include outline 44 and profile 42 for shim 36, which may include a set of locations and values of deviations (typically those greater than the design tolerance) of the skin's as-built thickness values from the skin's designed thickness profile. In any of the foregoing cases for model 114 for shim 36, model 114 may include definition of an assembly hole (see FIG. 17) to be formed during construction of shim 36 and aligned with pre-formed assembly holes of one or both of the skin and the substructure. Model 114 for sacrificial material 350 may include a set of horizontal coordinate pairs and thickness values for the sacrificial material before and after application, curing, and machining. Generally, such thickness values will correspond to deviations 334 of the as-built thickness values of the skin from the digital model of the skin. Typically, such thickness values only include those that are greater than design allowance 342. Model 114 for one or more sacrificial material layers 350 may also include a ply-cutting plan identifying the size, i.e., an outline, and thickness of each layer of sacrificial material, thus defining in three dimensions a set of sacrificial material layer data corresponding to the set of deviations 334 (typically those greater than design tolerance 342) of the as-built thickness values for the skin from the nominal map of the skin thickness. Model 114 may also include a set of data relating to the thickness of the layer after application and curing and a set of data for machining the applied, cured sacrificial material on skin 20. In any of the foregoing cases for model 114 for sacrificial material layers 350, model 114 may include definition of an assembly hole (see FIG. 17) to be formed in sacrificial material layers 350 and aligned with pre-formed assembly holes of one or both of the skin and the substructure.

Figure 10:
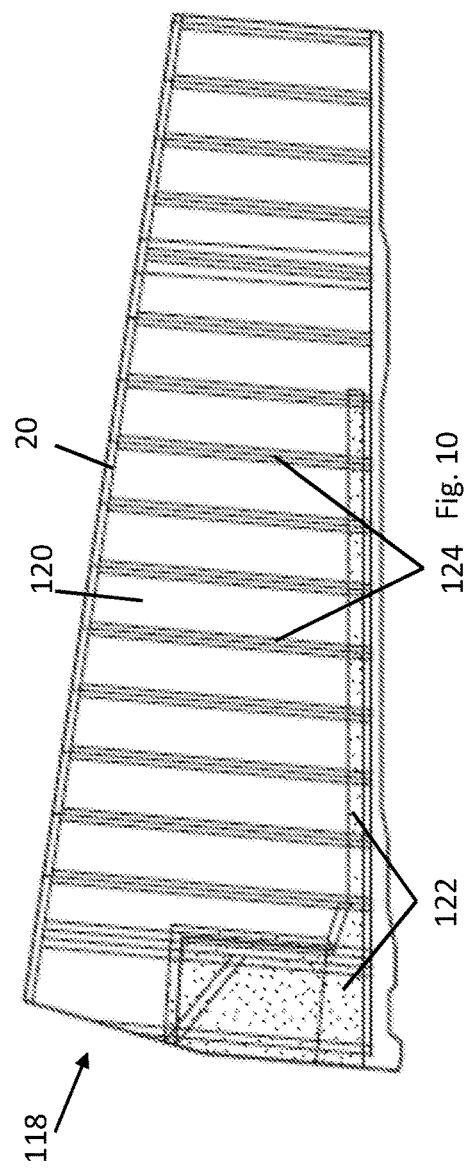
FIG. 10 is a plan view of a representation of the inspection results for the aero-surface of FIG. 8, illustrating with variant cross-hatching and stippling a set of as-built thickness values for the aero-surface distributed over the horizontal dimensions of the aero-surface.

FIG. 10 shows an ultrasonic scan 118 of skin 20, which, in the particular example, is formed of composite material. The process of forming a skin of composite material may produce variations in the thickness of the skin. Other methods of forming parts also may result in thickness variations. The varying thickness values found by ultrasonic scan 118 over the two-dimensional area of skin 20 are illustrated in FIG. 10: blank spaces 120 represent areas of minimum thickness; areas of stippling 122 represent areas of medium thickness; and lines 124 represent areas of the maximum thickness.

FIG. 10 is a representation of the profile of the as-built thickness structure of skin 20 in two horizontal dimensions and in a thickness dimension, displaying thickness values for skin 20 over a plurality of locations in the two horizontal dimensions. This representation is simplified for illustrative purposes and typically the nondestructive inspection produces accurate, high-resolution (e.g., to as fine as 0.0001-inch) measurements of the as-built thickness values and of the location coordinates in the horizontal dimensions. An ultrasound inspection of the as-built structure of a part may provide an advantage over other methods of part inspection (both manual and automated) for predicting an assembly gap and/or determining the need for shimming and/or addition of sacrificial plies, which may be attributed to the degree of accuracy resulting from the ultrasound inspection. The results, such as the set of deviations of the as-built thickness profile from the designed thickness profile, from such inspection may be recorded in a database for use in subsequent production of another skin. The results may be useful for purposes of establishing and controlling manufacturing assembly process capability, e.g., in identifying a trend in variations in production that will allow adjustment of production variables to reduce deviations of the as-built structure from the designed structure.

Figure 11:
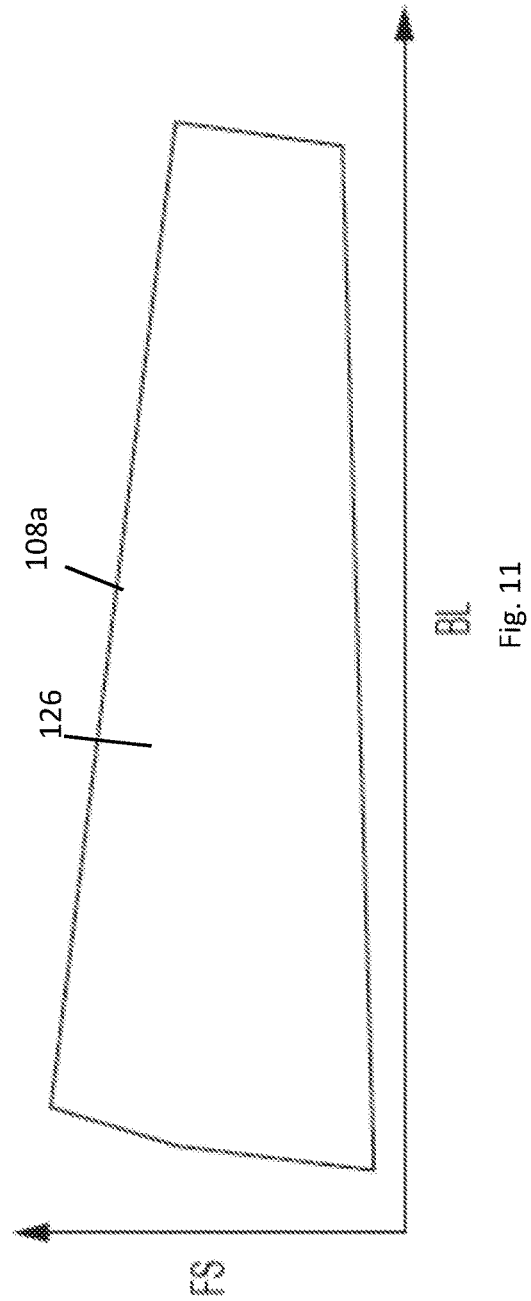
FIG. 11 is a plan view of a digital model for the aero-surface of FIG. 8, illustrating a nominal map of the designed thickness profile of the aero-surface over the horizontal dimensions or outline of the aero-surface, in this case the designed thickness profile being a constant over the horizontal dimensions of the aero-surface, and the horizontal outline being shown in aircraft coordinates: fuselage station (FS), and butt line (BL).

A representation of a digital model 108a of skin 20 is shown in FIG. 11, illustrating the nominal map of the designed thickness profile of skin 20. In this case, the designed thickness profile is a constant thickness value over the horizontal dimensions of the skin, indicated by the unstippled, unlined area 126. Digital model 108a of skin 20 may include one or more coordinate systems for identifying horizontal locations: for example, a part-specific coordinate system, such as that using dimensions 80, 82 as shown in FIG. 9, or an aircraft-specific coordinate system, such as that using aircraft coordinates fuselage station (FS) and butt line (BL) as shown in FIG. 11. Generally, each coordinate system will include one or more reference locations for registering and synchronizing such coordinate system with another coordinate system.

Figure 12:
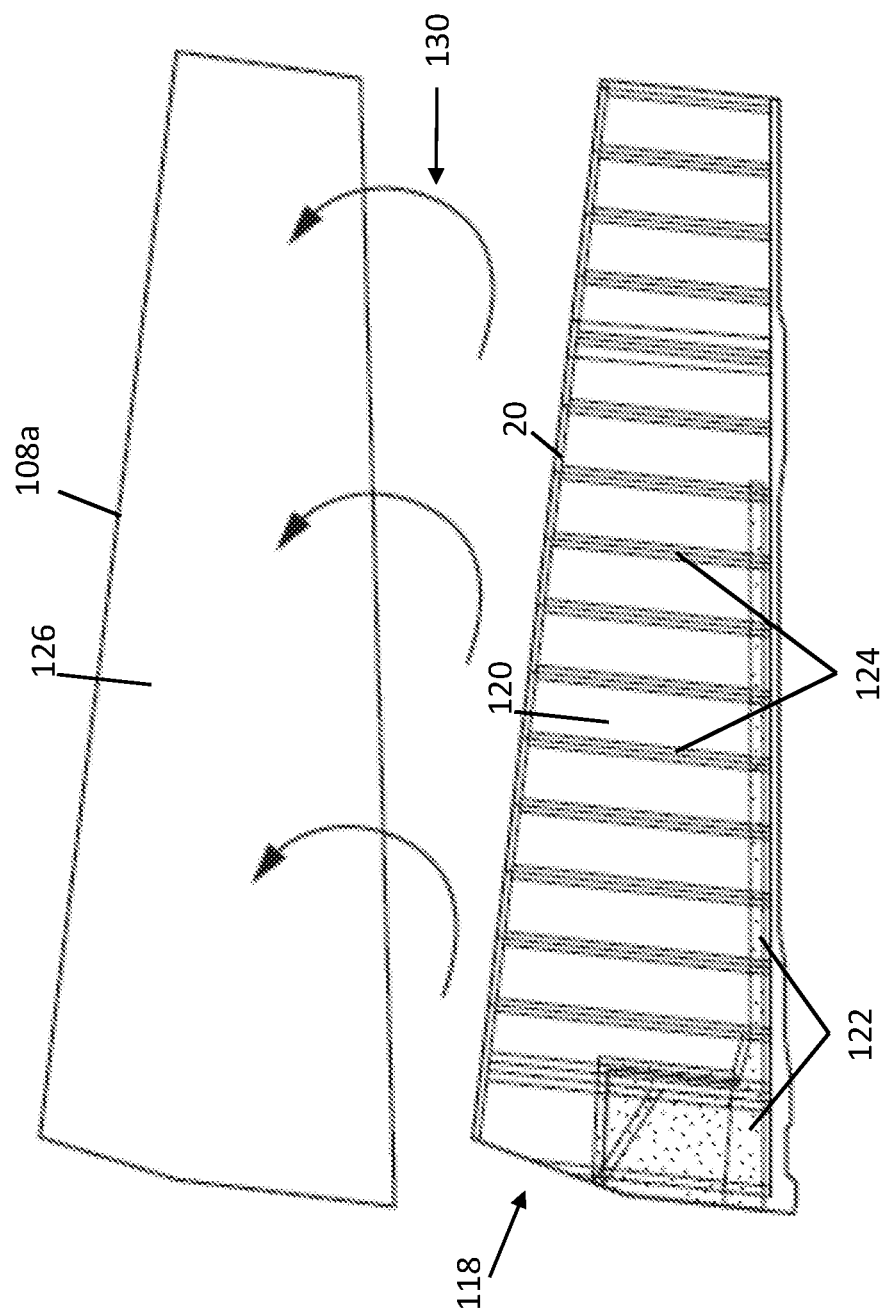
FIG. 12 is a plan view illustrating how the as-built thickness values of the aero-surface may be virtually overlaid on the digital model of the nominal map of the aero-surface.

An illustration is shown in FIG. 12 of virtually overlaying ultrasonic scan 118 of as-built thickness values of skin 20 onto digital model 108a of the nominal map of skin 20. Computer system 106 may perform such virtual overlaying and predict areas that may potentially require a shim and/or sacrificial material and manufacturing such shim(s) and/or sacrificial material, all in an automated fashion. Alternatively, an operator can manually select areas for potential shimming and/or addition of sacrificial material, using a graphic interface to the representation of the as-built thickness profile. The graphic interface may also overlay the as-built thickness profile on the digital model of the skin and/or the digital model of the substructure and/or a representation of the as-built substructure to aid in selecting areas for potential shimming and/or adding sacrificial material.

Substructure 28 may similarly be inspected, e.g., by a nondestructive process such as ultrasound, which may gather information about the as-built structure of substructure 28. The information about the as-built structure may be compared to the digital model of the substructure and used alone or in combination with information about the as-built structure of the skin for predicting and manufacturing a shim and/or cutting, applying, curing, and machining sacrificial material for a joint between the skin and the substructure.

Arrows 130 in FIG. 12 represent how a coordinate system for the as-built thickness profile may require registration and synchronization with the digital model of the designed thickness profile. For example, coordinates from the scan of the as-built part may be in a coordinate system unique to that scan or may be unique to the type of part that was scanned. Information in such a coordinate system may need to be transformed into a coordinate system specific to the digital model of the part. Such digital model may be, for example, in aircraft coordinates, which may require registration and synchronization with the scan coordinates. Typically, each point on the ultrasonic scan is defined by a coordinate pair that can be mapped to corresponding aircraft coordinates.

Figure 13:
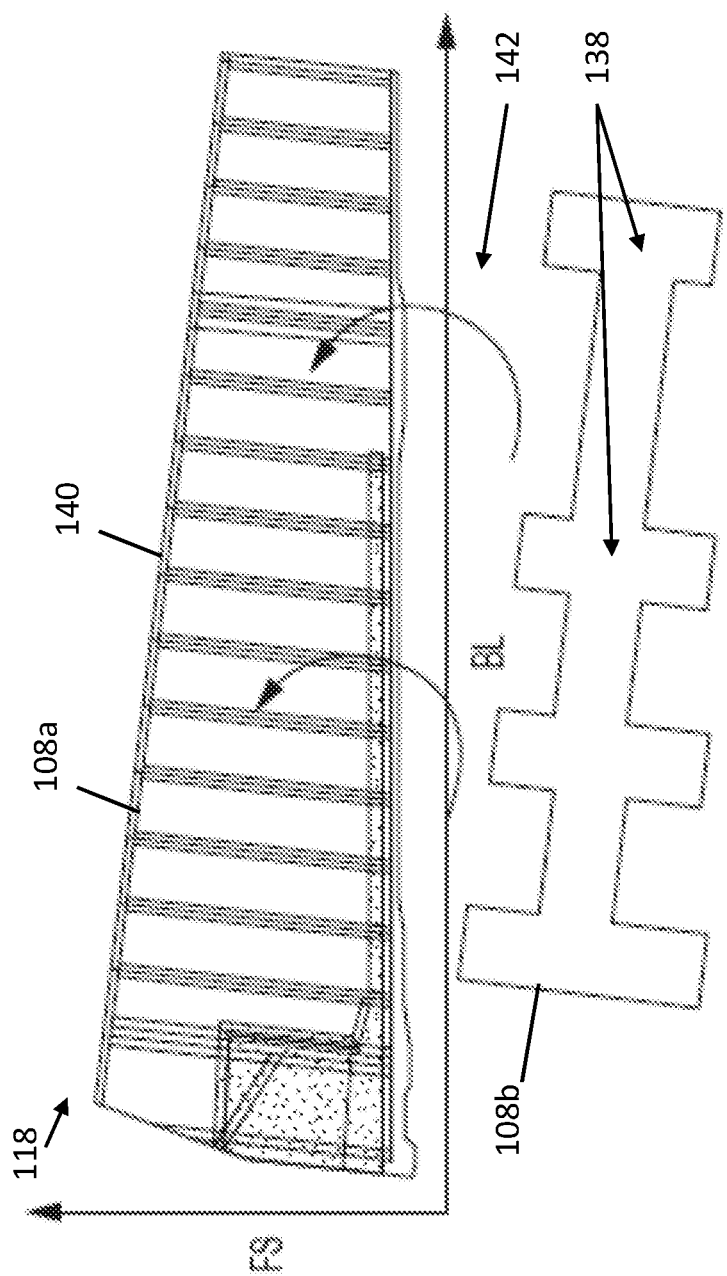
FIG. 13 is a plan view illustrating, in aircraft coordinates, the as-built thickness values of the aero-surface virtually overlaid on the digital model of the nominal map of the aero-surface, and illustrating how a digital model of an outline of a substructure, to which the aero-surface will be mounted, may be virtually overlaid on the combined as-built thickness values and digital model of the aero-surface.

A combined map 140, shown in FIG. 13, results from the virtually overlaying of the as-built thickness profile onto the digital model of the nominal map of the skin. Combined map 140 may include aircraft coordinates FS, BL that may be useful in the next step, also shown in FIG. 13, of registering and synchronizing a digital model 108b of substructure 28, to which skin 20 will be assembled. Digital model 108b of substructure 28 may be in aircraft coordinates, facilitating its being virtual overlaid on combined map 140. Alternatively, if digital model 108b is in a different coordinate system then a process of transformation may be necessary to register and synchronize digital model 108b with combined map 140. In any case, arrows 142 illustrate this virtual overlaying with such registering and synchronization as may be necessary for a particular application.

Figure 14:
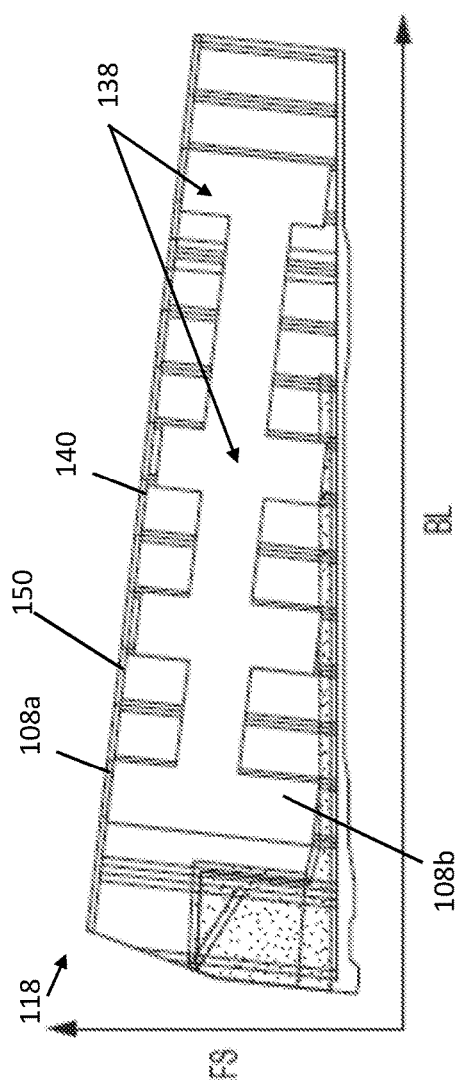
FIG. 14 is a plan view illustrating the virtual overlaying of the as-built thickness and the digital model of the nominal map of the aero-surface, and illustrating how a digital model of an outline of a substructure, to which the aero-surface will be mounted, may be virtually overlaid on the combined as-built thickness values and digital model of the aero-surface.

A virtual assembly map 150, shown in FIG. 14, is the result of virtually overlaying digital model 108b of substructure 28 on combined map 140 (of the as-built skin structure on the model of skin 20). Virtual assembly map 150 may include aircraft coordinates, or may use another coordinate system as best suited for registering and synchronizing the components of map 150 for the virtual overlay.

Digital model 108b as depicted in FIGS. 13 and 14 represents one or more mating areas 138 of substructure 28 where upper surface 30 (FIG. 17) of substructure 28 may be intended to be in contact with, and assembled to, skin 20. Mating area(s) 138 may be plural separate areas on upper surface 30 of substructure 28 or may be substantially all of upper surface 30. Typically, the portion(s) of upper surface 30 that is/are mating area(s) 138 is/are identified as such in digital model 108b.

Figure 15:
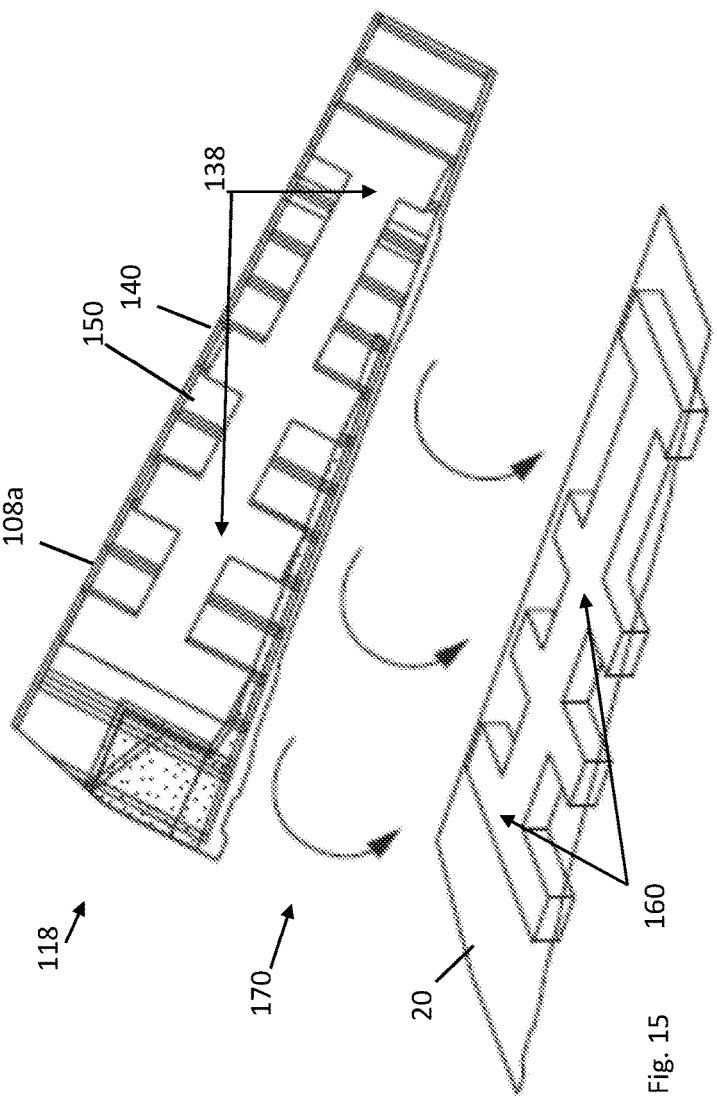
FIG. 15 is an isometric view illustrating a transformation of the virtual overlays of FIGS. 12-14 for calculating a set of deviations of the as-built thickness values from the nominal map of the aero-surface thickness.

FIG. 15 illustrates how one or more mating area(s) 160 of skin 20 with substructure 28 may be determined by relating the digital models of the outlines of the skin and the substructure. As described above, mating area(s) 138 of substructure 28 have been related to digital model 108a of skin 20 by registering and synchronizing them with the combined as-built and designed map 140 of skin 20 in virtual assembly map 150. The virtual overlaying depicted in FIGS. 13-15 may be considered a virtual skin up net fit check using at least the as-built thickness and digital model of skin 20, a digital model of substructure 28, the skin mating area 160, and the substructure mating area 138.

With mating area(s) 160 of skin 20 determined, computer system 106 may generate digital model 114 of the outline and profile of shim 36 and/or sacrificial material 350 by calculating in mating area(s) 160 of skin 20 a set of locations and values of deviations of the as-built thickness values from the designed thickness profile. The determination of where to add a shim and where to add sacrificial material is further described in reference to FIG. 25 below. Alternatively, computer system 106 may calculate a set of locations and values of deviations of the as-built thickness values from the designed thickness profile prior to a determination of mating area(s) 160. In this alternative case, typically a determination of mating area(s) 160 will be made, or an area for potential shimming or sacrificial material will be otherwise determined, and digital model 114 of shim 36 or sacrificial material 350 will be generated only for such area(s). See FIGS. 18 and 19 for shimming and FIGS. 18a and 19a for sacrificial material.

FIG. 15 also illustrates with arrows 170 that the as-built thickness values in scan 118 may be inverted to simulate mechanical joining of parts 20 and 28. Such inversion may facilitate calculating, as illustrated by FIG. 16, the set of deviations 34 or 334 greater than the applicable design tolerance that may be used in digital model 114 of shim 36 or sacrificial material 350. Generally speaking, a smaller design tolerance is applicable to sacrificial material because sacrificial material may be added in thinner increments as compared to a shim, and sacrificial material also may be machined after being applied to part 20 or 28 to further reduce the thickness of the sacrificial material.

As described above, such calculating of deviations 34 or 334 for model 114 of shim 36 or sacrificial material 350 may be performed automatically, or, may involve an operator using a visualization of the deviations from the nominal map to analyze, on a case by case basis, potential shimming or sacrificial material across the areas that correspond to the mating surfaces of the skin with the substructure. For example, the operator may take a variety of slices across the mating area(s) to obtain the profile of the shim or sacrificial material. In either case, as described above, once the profile of the shim or sacrificial material (both before and after machining) is/are known, model 114 of the shim or sacrificial material may be created and exported. For a shim this is typically exported to an NC program for machining, or to an additive manufacturing installation for 3D printing. For sacrificial material this is typically exported to a ply-cutting device.

As shown in FIG. 17, an assembly 180 of skin 20 at inner surface 22 to substructure 28 at upper surface 30 may include shims 36a, 36b or sacrificial material 350a, 350b that have been machined as necessary. Assembly 180 may involve a pre-formed hole 182 in skin 20, a pre-formed hole 184 in substructure 28, and a pre-formed hole 186 in shim 36b or sacrificial material 350b. One or more fasteners 188 may fix the parts together at holes 182, 184 and similar sets of holes. Typically, pre-formed holes 182 and 184 in the skin and substructure must be aligned with a high degree of accuracy. Hole 186 in shim 36b or sacrificial material 350b may be pre-formed with a corresponding degree of accuracy due to the high degree of accuracy in the location by ultrasound inspection of thickness deviations in the skin and the ability, in the subsequent location of hole 186 in shim 36b or sacrificial material 350b, to identify such location in a coordinate system, such as an aircraft coordinate system common to both the skin and the substructure.

FIG. 18 provides a flowchart illustrating a set of operations 202 performed to predict the location, outline, and profile of shim 36 to fill gap 32 between substructure 28 and skin 20. Operations 202 may include a step 204 of providing digital models of designs for a skin and a substructure. Operations 202 may include a step 206 of manufacturing the skin and determining the as-built thickness values for the skin. Operations 202 may include a step 208 of determining the mating areas 138, 160 of the skin and the substructure. Operations 202 may include a step 210 of calculating in the mating areas a set of the deviations of the skin's as-built thickness from the skin's digital model. Operations 202 may include a step 212 of generating a digital model of a shim corresponding to the set of deviations greater than the engineering shim design allowance. Operations 202 may include a step 214 of manufacturing the shim from the digital model. For the one or more embodiments represented by FIG. 18, the step of virtual determination of mating areas 138, 160 of substructure 28 and skin 20 is performed before the step of calculating the set of deviations of the skin's as-built thickness values from the skin's nominal thickness values. After determination of mating areas 138, 160, the calculating of the set of deviations may be performed only in the mating area. The generation of digital model 114 of shim 36 may be accomplished using the deviations.

FIG. 19 provides a flowchart illustrating a set of operations 220 also performed to predict the location, outline, and profile of shim 36 to fill gap 32 between substructure 28 and skin 20. Operations 220 may include a step 222 of providing a digital model of a design for a skin. Operations 220 may include a step 224 of manufacturing the skin and determining the as-built thickness values for the skin. Operations 220 may include a step 226 of calculating a set of the deviations of the skin's as-built thickness from the skin's digital model. Operations 220 may include a step 228 of determining a potential shimming area, e.g., by providing a digital model of a design for a substructure and determining the mating areas 138, 160 of the skin and the substructure. Operations 220 may include a step 230 of generating a digital model of a shim corresponding to the set of deviations in the potential shimming area greater than the engineering shim design allowance. Operations 220 may include a step 232 of manufacturing the shim from the digital model. For the one or more embodiments represented by FIG. 19, the step of calculating the set of deviations of the skin's as-built thickness values from the skin's nominal thickness values is formed prior to, or otherwise without making use of information about the mating areas 138, 160. The step of virtual determination of mating areas 138, 160 of the skin and substructure may be performed after the calculating of the set of deviations. Typically, the step of calculating the set of deviations according to FIG. 19 will be performed for the entirety of the skin outline. In a FIG. 19 embodiment, a determination of mating areas 138, 160 may be made, or an area for potential shimming may be otherwise determined, and digital model 114 of shim 36 will be generated only for such area(s).

FIG. 18a provides a flowchart illustrating a set of operations 402 performed to predict the location, outline, and profile of sacrificial material 350 to fill gap 332 between substructure 28 and skin 20. Operations 402 may include a step 404 of providing digital models of designs for a skin and a substructure. Operations 402 may include a step 406 of manufacturing the skin and determining the as-built thickness values for the skin. Operations 402 may include a step 408 of determining the mating areas 138, 160 of the skin and the substructure. Operations 402 may include a step 410 of calculating in the mating areas a set of the deviations of the skin's as-built thickness from the skin's digital model. Operations 402 may include a step 412 of generating a digital model of one or more layers of sacrificial material 350 corresponding to the set of deviations greater than the engineering design allowance. Operations 402 may include a step 414 of cutting one or more layers of sacrificial material according to the digital model. For the one or more embodiments represented by FIG. 18a, the step of virtual determination of mating areas 138, 160 of substructure 28 and skin 20 is performed before the step of calculating the set of deviations of the skin's as-built thickness values from the skin's nominal thickness values. After determination of mating areas 138, 160, the calculating of the set of deviations may be performed only in the mating area. The generation of digital model 114 of sacrificial material 350 may be accomplished using the deviations.

FIG. 19a provides a flowchart illustrating a set of operations 420 also performed to predict the location, outline, and profile of sacrificial material 350 to fill gap 332 between substructure 28 and skin 20. Operations 420 may include a step 422 of providing a digital model of a design for a skin. Operations 420 may include a step 424 of manufacturing the skin and determining the as-built thickness values for the skin. Operations 420 may include a step 426 of calculating a set of the deviations of the skin's as-built thickness from the skin's digital model. Operations 420 may include a step 428 of determining a potential sacrificial material area, e.g., by providing a digital model of a design for a substructure and determining the mating areas 138, 160 of the skin and the substructure. Operations 420 may include a step 430 of generating a digital model of one or more layers of sacrificial material 350 corresponding to the set of deviations in the potential sacrificial material area greater than the engineering design allowance. Operations 420 may include a step 432 of cutting layers of sacrificial material according to the digital model. For the one or more embodiments represented by FIG. 19a, the step of calculating the set of deviations of the skin's as-built thickness values from the skin's nominal thickness values is formed prior to, or otherwise without making use of information about the mating areas 138, 160. The step of virtual determination of mating areas 138, 160 of the skin and substructure may be performed after the calculating of the set of deviations. Typically, the step of calculating the set of deviations according to FIG. 19a will be performed for the entirety of the skin outline. In a FIG. 19a embodiment, a determination of mating areas 138, 160 may be made, or an area for potential sacrificial material may be otherwise determined, and digital model 114 of sacrificial material 350 will be generated only for such area(s).

Figure 20:
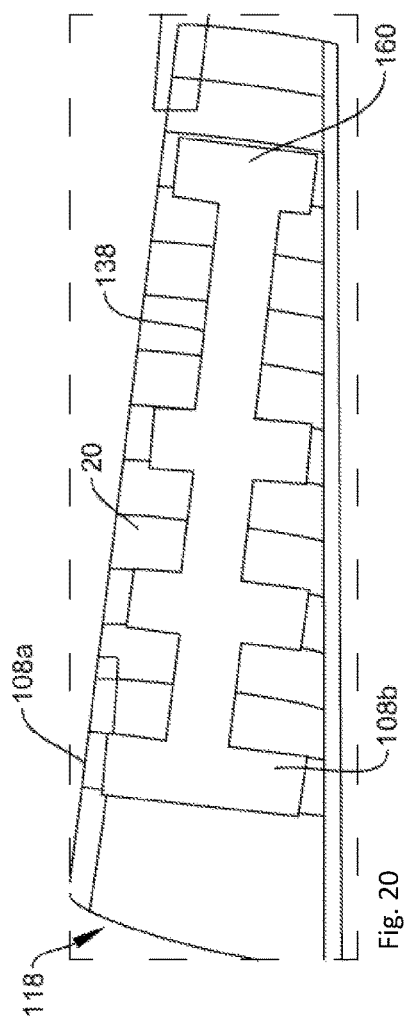
FIG. 20 is a plan view illustrating the virtual overlaying of an as-built thickness and a digital model of a nominal map of an aero-surface, and illustrating how a digital model of an outline of a substructure, to which the aero-surface will be mounted, may be virtually overlaid on the combined as-built thickness values and digital model of the aero-surface.
Figure 21:
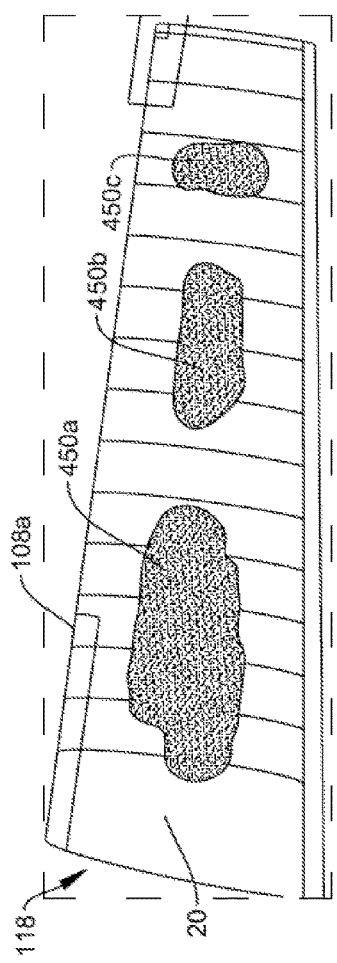
FIG. 21 is a plan view of the as-built thickness and the digital model of the nominal map of the aero-surface as in FIG. 20, and illustrating areas (in this case, three areas) in which the as-built thickness of the aero-surface deviates more than a design allowance, but less than a shimming allowance, from the nominal thickness values.

An illustration is shown in FIG. 20 of ultrasonic scan 118 of as-built thickness values of skin 20 virtually overlaid onto digital model 108a of the nominal map of skin 20 and also digital model 108b of substructure 28 and mating areas 138, 160. As described above, computer system 106, automatically and/or with an operator, may perform such virtual overlaying and predict areas that may potentially require sacrificial material and the location, outline, and profile of such sacrificial material 350. Such areas 450a-c, which may correspond with the location(s) of one or more gaps 332, are shown in FIG. 21 on skin 20. Gaps 332 associated with areas 450a-c may be caused by manufacturing variations and may be of any shape, for example the irregular outlines shown in FIG. 21. Gaps 332 associated with areas 450a-c typically are smaller than the shimming design allowance where sacrificial material may be applied to fill the gaps where a shim would be too thick. The virtual overlaying depicted in FIGS. 20-21 may be considered a virtual skin up net fit check using at least the as-built thickness of skin 20 and a digital model of substructure 28, the skin mating area 160, and the substructure mating area 138.

Figure 22:
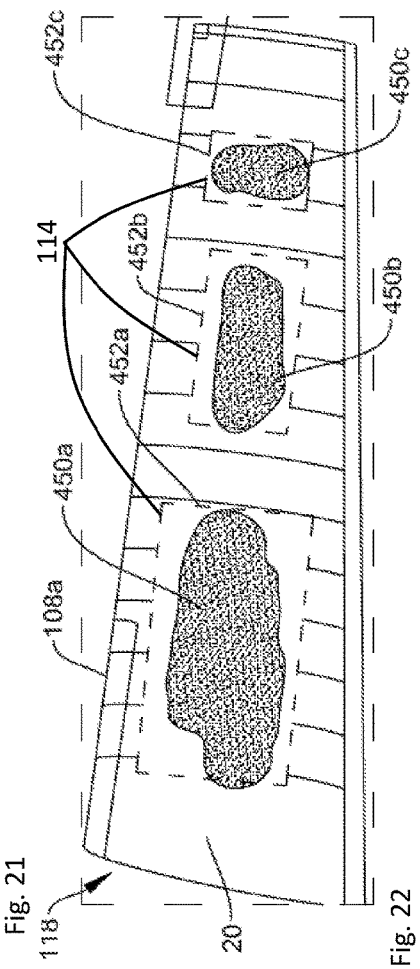
FIG. 22 is a plan view of the as-built thickness and the digital model of the nominal map of the aero-surface as in FIG. 20, and illustrating additional layers of sacrificial material to be added to cover the three areas identified in FIG. 21.

As seen in FIG. 22, digital model 114 for sacrificial material 350 may include a set of outlines 452a-c that may be determined, e.g., by computer system 106, to encompass areas 450a-c, for example with substantially rectangular shapes. For application to a part made of composite material, sacrificial material 350 is typically cut in substantially rectangular sections. Outlines 452a-c may be substantially rectangular and larger than areas 450a-c, which may be useful in ensuring that the sacrificial material covers all of gaps 332 associated with areas 450a-c. Alternatively, outlines 452a-c may be determined to have any suitable shape, e.g., a shape conforming to the shapes of areas 450a-c, with more or less additional space surrounding areas 450a-c. As depicted in FIG. 22, outlines 452a-c encompass all of areas 450a-c, irrespective of mating areas 138, 160 of skin 20 with substructure 28.

Figure 23:
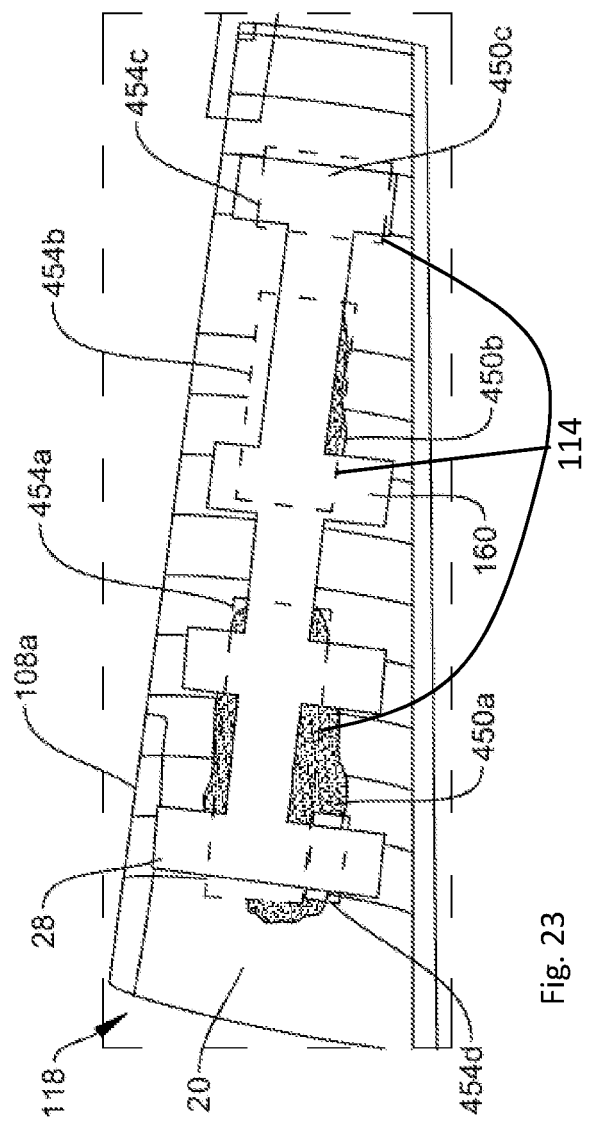
FIG. 23 is a plan view of the as-built thickness and the digital model of the nominal map of the aero-surface as in FIG. 20, with the underlying outline of the substructure, and illustrating the additional layers of sacrificial material to be added in three areas identified in FIG. 21 but only the areas where the aero-surface will be joined to the underlying substructure.

As depicted in FIG. 23, taking into consideration mating area(s) 138, 160 of skin 20 and substructure 28, computer system 106 may generate digital model 114 of sacrificial material 350 to include a set of areas 454a-d that encompass the portions of areas 450a-c that are in mating area(s) 138, 160.

Sacrificial material such as a fiberglass/epoxy prepreg may be available in sheets with a fixed set of varying thicknesses. Computer system 106 may generate for digital model 114 a map of the thickness of sacrificial material 350, which may include an identification of the number of layers or sheets at each area 452 or 454 based on the thickness of each layer or sheet, such that the final number of layers will be sufficient to address dimensional mismatch in mating areas.

Figure 24:
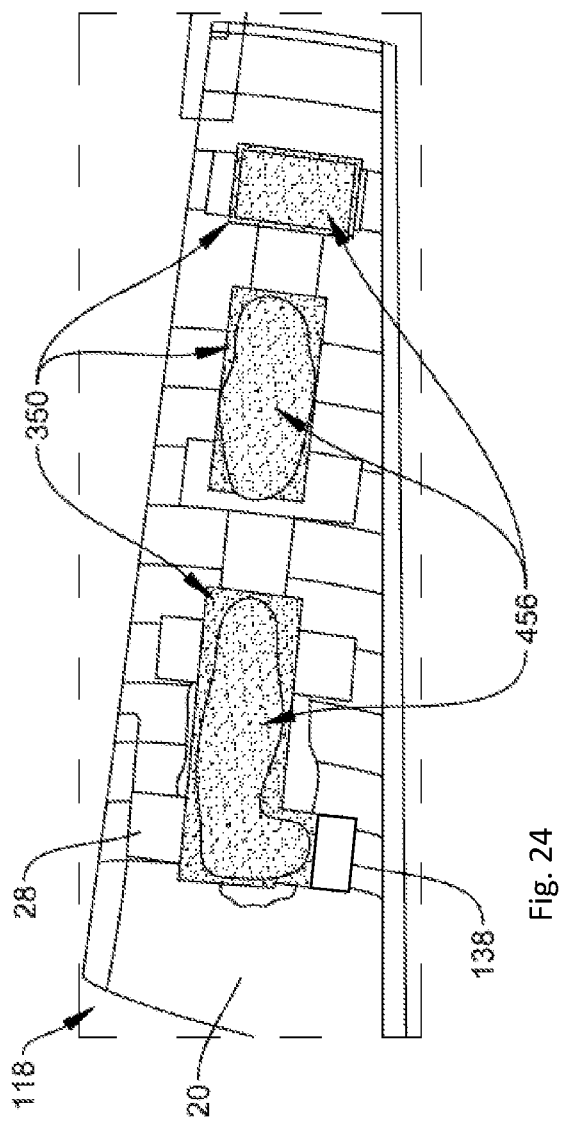
FIG. 24 is a plan view of the as-built thickness and the digital model of the nominal map of the aero-surface as in FIG. 20, with the underlying outline of the substructure, and illustrating the additional layers of sacrificial material to be added as in FIG. 23, and illustrating the portion of the sacrificial material remaining after a machining process.

As shown in FIG. 24, sacrificial material 350 may be applied to skin 20 in one more areas 452 or 454. After application, sacrificial material 350 is typically cured. Additionally, digital model 114 of sacrificial material layer data may include a set of sacrificial material removal data. Sacrificial material 350 may be machined to remove any portion of skin 20 that is thicker than the designed thickness. This may produce, as seen in FIG. 24, areas 456 where the portion of sacrificial material remaining after machining is filling in at least a portion of gaps 332, reducing the gap in the joint between skin 20 and substructure 28.

Figure 25:
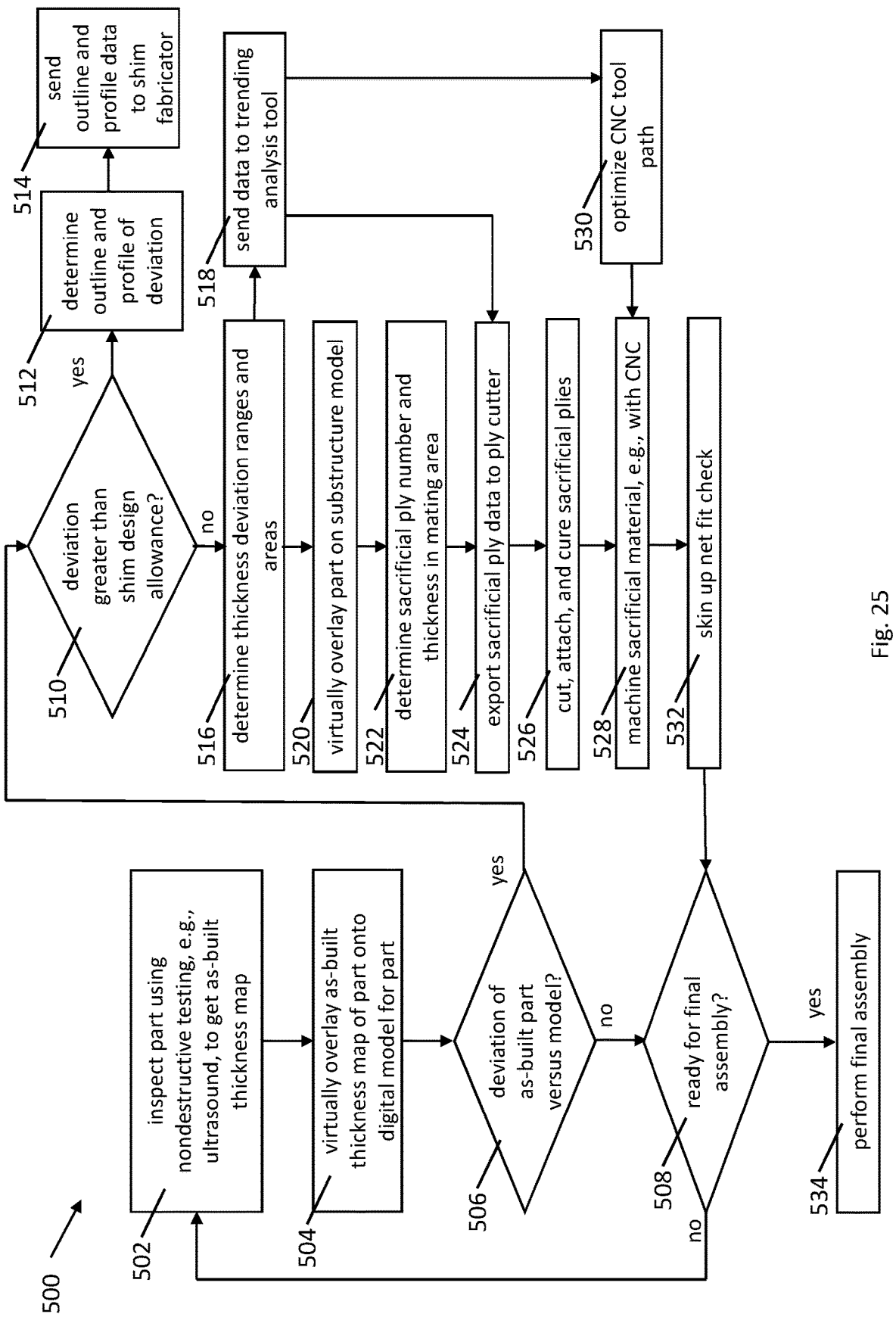
FIG. 25 is an illustration of operations performed in one or more embodiments of the present disclosure, showing the steps for gathering data using nondestructive testing and comparing the as-built thickness to a digital model of the part and determining locations, area, and depth for any sacrificial material to be added to the skin, and locations and size for any shims to be prepared, in order to reduce gaps between the skin and the substructure.

FIG. 25 is a flowchart depicting one or more embodiments of the present disclosure whereby the number of times that parts need to be fitted to their corresponding structure before being finally assembled, i.e., the number of skin-up fit checks, is reduced or even eliminated. A method 500 for inspecting the thickness profile of an as-built part and determining the need for shim(s) and/or sacrificial material layer(s) begins at 502 with inspecting the part using non-destructive testing, e.g., ultrasound. The inspection produces an as-built thickness map. Then the as-built thickness map is overlaid at 504 on a digital model for the part. The map is compared at 506 to the model to determine any and all deviations from the model. If no deviation greater than a design allowance (342, FIG. 1) is found, then a determination can be made at 508 whether the part is ready for final assembly. If a deviation greater than the design allowance is found then a determination may be needed to decide whether to add a shim or sacrificial material. The deviation is further evaluated at 510 to determine if it is greater than a shim design allowance. If the deviation is greater than the shim design allowance then an outline and a profile of the deviation is determined and the data is sent at 514 to a machine or process for fabricating a shim to have that outline and profile.

If the deviation is greater than a design allowance but less than the shim design allowance, then the thickness deviation ranges and areas are determined at 516. This data is also exported at 518 to a trending analysis tool to track manufacturing variations for process improvement within this process and for other processes. The part model is virtually overlaid at 520 on a model of the substructure to which the part will be joined. With the mating area determined, the number of sacrificial plies and their thicknesses to be applied over any deviation areas in the mating area are determined at 522. The data on the sacrificial plies is exported at 524 to a ply cutter, which may also be informed by data from the trending analysis tool. The sacrificial plies are cut, attached, and cured at 526 to the part. The sacrificial material is machined at 528, for example, with a CNC milling tool, which may also make use of data from the trending analysis tool, e.g., to optimize the path that the milling tool takes in machining the sacrificial material. With the dimensions for any shim and/or machined sacrificial material now known, the dimensions may be added to the models of the skin and substructure in the virtual overlaying of the parts, and as described above, for FIGS. 13-15 and FIGS. 20-21 a virtual skin up net fit check may be performed using at least the as-built thickness of skin 20 and a digital model of substructure 28, the skin mating area 160, the substructure mating area 138, the shim dimension data, and the sacrificial material layer data.

With the shim(s) and/or machined sacrificial material applied, the part is ready for a skin-up net fit check at 532 to determine at 508 if the part is ready for final assembly. If the part is ready, then it is finally assembled at 534 to the substructure.

Aspects of one or more embodiments of the present disclosure for a system and method for predictive shimming of joints and/or adding sacrificial material may be embodied as a computer method, computer system, or computer program product. Accordingly, aspects of one or more embodiments of the present disclosure for a system and method for predictive shimming of joints may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of one or more embodiments of the present disclosure for a system and method for predictive shimming of joints may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, radio frequency (RF), and/or the like, and/or any suitable combination of these.

Computer program code for carrying out operations for aspects of the one or more embodiments of the present disclosure for a system and method for predictive shimming of joints may be written in one or any combination of programming languages, including an object-oriented programming language such as Java, Smalltalk, C++, and/or the like, and conventional procedural programming languages, such as the C programming language. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), and/or the connection may be made to an external computer (for example, through the Internet using an Internet Service Provider).

Aspects of one or more embodiments of the present disclosure for a system and method for predictive shimming of joints and/or adding sacrificial material are described above with reference to flowchart illustrations and/or block diagrams of methods, apparatuses, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block or blocks.

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block or blocks.

Any flowchart and/or block diagram in the drawings is intended to illustrate the architecture, functionality, and/or operation of possible implementations of systems, methods, and computer program products according to aspects of one or more embodiments of the present disclosure for a system and method for predictive shimming of joints. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

We claim:

1. A method for adding one or more layers of sacrificial material to a skin for assembling the skin to a substructure, the skin defining an inner surface, an outer surface opposite the inner surface, and a skin thickness between the inner and outer surfaces, the substructure defining a mating surface for the skin, wherein a digital model associated with the skin includes a nominal map of the skin thickness, the sacrificial material added to fill any gaps that are greater than a design allowance and less than a minimum shim thickness in a mating area between the inner surface of the skin and the substructure, the method comprising the steps of:
   a. nondestructively inspecting the skin at a plurality of locations of at least one of the inner and outer surfaces to gather a data set relating to the skin thickness;
   b. calculating, using the data set, a set of as-built thickness values for the skin for at least a portion of the plurality of locations;
   c. determining the mating area of the inner surface of the skin with the mating surface of the substructure;
   d. generating a set of sacrificial material layer data by calculating in the mating area of the inner surface of the skin a set of deviations greater than the design allowance of the set of as-built thickness values from the nominal map of the skin thickness; and
   e. using the set of sacrificial material layer data to prepare the one or more layers of sacrificial material.

2. The method of claim 1 further including a step of generating a set of sacrificial material removal data using the set of sacrificial material layer data and the set of deviations greater than the design allowance of the set of as-built thickness values from the nominal map of the skin thickness.

3. The method of claim 2 further including steps of adding the one or more layers of sacrificial material to the skin and removing a portion of the sacrificial material from the skin based on the set of sacrificial material removal data.

4. The method of claim 1 further including a step of adding the one or more layers of sacrificial material to the skin.

5. The method of claim 1 wherein the step of generating the set of sacrificial material layer data includes determining one or more areas for sacrificial material sufficient to cover the deviations greater than the design allowance in the mating area of the inner surface of the skin.

6. The method of claim 1 wherein the step of determining the mating area of the skin with the substructure precedes the step of calculating the set of as-built thickness values for the skin, and further wherein the as-built thickness values of the skin are calculated only in the mating area of the skin.

7. The method of claim 1 wherein the step of nondestructively inspecting the skin to gather the data set includes using ultrasound to inspect the skin.

8. The method of claim 1 for use with the substructure wherein the substructure defines a thickness and wherein a digital model associated with the substructure includes a nominal map of the substructure thickness and including the steps of:
   a. nondestructively inspecting the substructure to gather a data set relating to the substructure thickness;
   b. calculating, using the substructure data set, a set of as-built thickness values for the substructure; and
   c. generating a set of sacrificial material layer data for at least one of the skin and the substructure by calculating in the mating area of the inner surface of the skin a set of deviations greater than the design allowance of the set of as-built thickness values from the nominal map of the skin thickness.

9. The method of claim 1 wherein the as-built thickness values for the skin includes thickness values in two horizontal dimensions and in a thickness dimension.

10. A method for reducing gaps in a joint assembly of a skin to a substructure, the skin defining an inner surface, an outer surface opposite the inner surface, and a skin thickness between the inner and outer surfaces, the substructure defining a mating surface for the skin, wherein a digital model associated with the skin includes a nominal map of the skin thickness, the method comprising the steps of:
   a. nondestructively inspecting the skin at a plurality of locations of at least one of the inner and outer surfaces to gather a data set relating to the skin thickness;
   b. calculating, using the data set, a set of as-built thickness values for the skin for at least a portion of the plurality of locations;
   c. determining a mating area of the inner surface of the skin with the mating surface of the substructure;
   d. calculating in the mating area of the inner surface of the skin a set of deviations greater than a design allowance of the set of as-built thickness values from the nominal map of the skin thickness;
   e. for any deviations greater than the design allowance and equal to or greater than a minimum shim thickness, constructing a shim to have an outline and profile to match the set of deviations; and
   f. for any deviations greater than the design allowance and less than a minimum shim thickness, preparing one or more layers of sacrificial material in the mating area between the inner surface of the skin and the substructure.

11. The method of claim 10 further including a step of attaching the one or more layers of sacrificial material to the skin.

12. The method of claim 11 further including a step of curing the one or more layers of sacrificial material on the skin.

13. The method of claim 11 further including a step of machining the one or more layers of sacrificial material.

14. A system for adding one or more layers of sacrificial material to a first part defining a first mating surface for assembly of the first part to a second part defining a second mating surface, wherein a first digital model, including a first nominal map in two horizontal dimensions and in a thickness dimension, is associated with the first part, and wherein a second digital model, including a second nominal map in two horizontal dimensions, is associated with the second part, the one or more layers of sacrificial material to be configured with an outline customized to cover an area within which a gap greater than a design allowance exists between the mating surfaces of the first part and the second part, the system comprising:
   a. a nondestructive inspection system configured to inspect the first part to gather a data set relating to the first part;
   b. a computer coupled to the nondestructive inspection system and configured to receive the data set relating to the first part and to store the first nominal map of the first part, the second nominal map of the second part, and the design allowance, the computer including a processing element configured to calculate, from the data set relating to the first part, an as-built thickness profile for at least a portion of the first part, and to virtually overlay the first nominal map of the first part on the second nominal map of the second part to determine a mating area of the first part and the second part, and to generate in the mating area a set of sacrificial material layer data by calculating a set of deviations greater than the design allowance of the as-built thickness profile of the first part from the nominal map of the first part; and
   c. a ply cutting device coupled to the computer to receive the sacrificial material layer data, the ply cutting device configured to cut the one or more layers of sacrificial material.

15. The system of claim 14 wherein the nondestructive inspection system includes an ultrasound system.

16. The system of claim 15 wherein the ultrasound system includes a pulse-echo or through-transmission technique to gather data.

17. The system of claim 14 wherein the computer records in a database the set of deviations of the as-built thickness profile of the first part from the nominal map of the first part for use in subsequent production of another first part.

18. The system of claim 14 further for use in constructing a shim defined by a set of dimension data, and wherein the processing element of the computer coupled to the nondestructive inspection system is further configured to generate in the mating area the set of shim dimension data by calculating a set of deviations greater than a shimming design allowance of the as-built thickness profile of the first part from the nominal map of the first part, and further comprising an additive manufacturing device coupled to the computer to receive the shim dimension data, the additive manufacturing device configured to construct the shim.

19. The system of claim 14 for use in constructing a shim defined by a set of dimension data, and wherein the processing element of the computer coupled to the nondestructive inspection system is further configured to generate in the mating area the set of shim dimension data by calculating a set of deviations greater than a shimming design allowance of the as-built thickness profile of the first part from the nominal map of the first part, and further comprising an additive manufacturing device coupled to the computer to receive the shim dimension data, the additive manufacturing device configured to construct the shim.

20. The system of claim 19 wherein the computer is configured to perform a virtual skin up net fit check using the as-built thickness of the first part, the second digital model of the second part, the shim dimension data, and the sacrificial material layer data.

* * * * *